(12) United States Patent
Ravikirthi et al.

(10) Patent No.: US 9,881,929 B1
(45) Date of Patent: Jan. 30, 2018

(54) MULTI-TIER MEMORY STACK STRUCTURE CONTAINING NON-OVERLAPPING SUPPORT PILLAR STRUCTURES AND METHOD OF MAKING THEREOF

(71) Applicant: SANDISK TECHNOLOGIES LLC, Plano, TX (US)

(72) Inventors: Pradhyumna Ravikirthi, San Jose, CA (US); Jayavel Pachamuthu, San Jose, CA (US); Jagdish Sabde, Fremont, CA (US); Peter Rabkin, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/335,850

(22) Filed: Oct. 27, 2016

(51) Int. Cl.
*H01L 27/11* (2006.01)
*H01L 27/11519* (2017.01)
(Continued)

(52) U.S. Cl.
CPC .... *H01L 27/11519* (2013.01); *H01L 27/1157* (2013.01); *H01L 27/11524* (2013.01);
(Continued)

(58) Field of Classification Search
CPC ......... H01L 27/11519; H01L 27/11524; H01L 27/11556; H01L 27/11565; H01L 27/1157; H01L 27/11582
See application file for complete search history.

(56) References Cited

U.S. PATENT DOCUMENTS 5,387,530 A 2/1995 Doyle et al.
5,915,167 A 6/1999 Leedy
(Continued)

FOREIGN PATENT DOCUMENTS

EP 1398831 A2 3/2004
WO WO2002/015277 A2 2/2002
(Continued)

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Whitney T Moore
*Assistant Examiner* — Joseph Galvin, III
(74) *Attorney, Agent, or Firm* — The Marbury Law Group PLLC

(57) ABSTRACT

A first tier structure including a first alternating stack of first insulating layers and first sacrificial material layers is formed over a substrate. First support openings and first memory openings, filled with first support pillar structures and sacrificial pillar structures, respectively, are formed through the first tier structure. A second tier structure including a second alternating stack of second insulating layers and second sacrificial material layers is formed thereabove. Second support openings and second memory openings are formed through the second tier structure such that the second support openings do not overlap with the first support pillar structures and the second memory openings overlie the sacrificial pillar structures. Inter-tier memory openings are formed by removal of the sacrificial pillar structures. Memory stack structures and second support pillar structures are formed in the inter-tier memory openings and the second support openings, respectively.

15 Claims, 28 Drawing Sheets

(51) Int. Cl.
*H01L 27/11565* (2017.01)
*H01L 27/11524* (2017.01)
*H01L 27/1157* (2017.01)
*H01L 27/11556* (2017.01)
*H01L 27/11582* (2017.01)

(52) U.S. Cl.
CPC .. *H01L 27/11556* (2013.01); *H01L 27/11565* (2013.01); *H01L 27/11582* (2013.01)

(56) References Cited

U.S. PATENT DOCUMENTS

| | | | |
|---|---|---|---|
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,349,681 | B2 | 1/2013 | Alsmeier et al. |
| 8,394,716 | B2 | 3/2013 | Hwang et al. |
| 8,445,347 | B2 | 5/2013 | Alsmeier |
| 8,450,181 | B2 | 5/2013 | Chen et al. |
| 8,614,126 | B1 | 12/2013 | Lee et al. |
| 8,658,499 | B2 | 2/2014 | Makala et al. |
| 8,741,761 | B2 | 6/2014 | Lee et al. |
| 8,847,302 | B2 | 9/2014 | Alsmeier et al. |
| 8,878,278 | B2 | 11/2014 | Alsmeier et al. |
| 8,884,357 | B2 | 11/2014 | Wang et al. |
| 8,928,061 | B2 | 1/2015 | Chien et al. |
| 8,946,023 | B2 | 2/2015 | Makala et al. |
| 9,023,719 | B2 | 5/2015 | Pachamuthu et al. |
| 9,230,973 | B2 | 1/2016 | Pachamuthu et al. |
| 9,230,979 | B1 | 1/2016 | Pachamuthu et al. |
| 9,230,987 | B2 | 1/2016 | Pachamuthu et al. |
| 9,305,934 | B1 | 4/2016 | Ding et al. |
| 9,305,937 | B1 | 4/2016 | Tsutsumi et al. |
| 9,397,046 | B1 | 7/2016 | Sharangpani et al. |
| 9,425,299 | B1 | 8/2016 | Rabkin et al. |
| 9,443,861 | B1 | 9/2016 | Pachamuthu et al. |
| 9,449,982 | B2 | 9/2016 | Lu et al. |
| 9,449,983 | B2 | 9/2016 | Yada et al. |
| 9,455,263 | B2 | 9/2016 | Zhang et al. |
| 9,460,931 | B2 | 10/2016 | Pachamuthu et al. |
| 9,478,558 | B2 | 10/2016 | Koka et al. |
| 9,570,463 | B1* | 2/2017 | Zhang ............... H01L 29/66666 |
| 9,627,403 | B2* | 4/2017 | Liu ................... H01L 27/11582 |
| 2006/0003531 | A1 | 1/2006 | Chang et al. |
| 2006/0258076 | A1 | 11/2006 | Mizushima et al. |
| 2007/0210338 | A1 | 9/2007 | Orlowski |
| 2007/0252201 | A1 | 11/2007 | Kito et al. |
| 2008/0067583 | A1 | 3/2008 | Kidoh et al. |
| 2008/0169496 | A1 | 7/2008 | Keller et al. |
| 2009/0026561 | A1 | 1/2009 | Reichenbach et al. |
| 2009/0121271 | A1 | 5/2009 | Son et al. |
| 2009/0242967 | A1 | 10/2009 | Katsumata et al. |
| 2010/0044778 | A1 | 2/2010 | Seol |
| 2010/0059811 | A1 | 3/2010 | Sekine et al. |
| 2010/0112769 | A1 | 5/2010 | Son et al. |
| 2010/0120214 | A1 | 5/2010 | Park et al. |
| 2010/0133599 | A1 | 6/2010 | Chae et al. |
| 2010/0155810 | A1 | 6/2010 | Kim et al. |
| 2010/0155818 | A1 | 6/2010 | Cho |
| 2010/0171162 | A1 | 7/2010 | Katsumata et al. |
| 2010/0181610 | A1 | 7/2010 | Kim et al. |
| 2010/0207195 | A1 | 8/2010 | Fukuzumi et al. |
| 2010/0213458 | A1 | 8/2010 | Prall |
| 2010/0320528 | A1 | 12/2010 | Jeong et al. |
| 2011/0065270 | A1 | 3/2011 | Shim et al. |
| 2011/0076819 | A1 | 3/2011 | Kim et al. |
| 2011/0133606 | A1 | 6/2011 | Yoshida et al. |
| 2011/0151667 | A1 | 6/2011 | Hwang et al. |
| 2011/0266606 | A1 | 11/2011 | Park et al. |
| 2011/0287612 | A1 | 11/2011 | Lee et al. |
| 2011/0312174 | A1 | 12/2011 | Lee et al. |
| 2012/0001247 | A1 | 1/2012 | Alsmeier |
| 2012/0001249 | A1 | 1/2012 | Alsmeier et al. |
| 2012/0003800 | A1 | 1/2012 | Lee et al. |
| 2012/0003831 | A1 | 1/2012 | Kang et al. |
| 2012/0052674 | A1 | 3/2012 | Lee et al. |
| 2012/0061744 | A1* | 3/2012 | Hwang ............ H01L 27/11565 257/324 |
| 2012/0068242 | A1 | 3/2012 | Shin et al. |
| 2012/0074367 | A1 | 3/2012 | Costa et al. |
| 2012/0140562 | A1 | 6/2012 | Choe et al. |
| 2012/0153376 | A1 | 6/2012 | Alsmeier et al. |
| 2012/0208347 | A1 | 8/2012 | Hwang et al. |
| 2012/0256247 | A1 | 10/2012 | Alsmeier et al. |
| 2012/0261638 | A1 | 10/2012 | Sills et al. |
| 2012/0261722 | A1 | 10/2012 | Tang et al. |
| 2012/0276719 | A1 | 11/2012 | Han et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2013/0313717 | A1 | 11/2013 | Holmes et al. |
| 2013/0322174 | A1 | 12/2013 | Li et al. |
| 2014/0225181 | A1 | 8/2014 | Makala et al. |
| 2014/0264525 | A1 | 9/2014 | Takahashi et al. |
| 2014/0264533 | A1 | 9/2014 | Simsek-Ege et al. |
| 2014/0264542 | A1 | 9/2014 | Simsek-Ege et al. |
| 2014/0273373 | A1 | 9/2014 | Makala et al. |
| 2015/0076580 | A1 | 3/2015 | Pachamuthu et al. |
| 2015/0118811 | A1 | 4/2015 | Makala et al. |
| 2015/0179660 | A1 | 6/2015 | Yada et al. |
| 2015/0294978 | A1 | 10/2015 | Lu et al. |
| 2016/0049423 | A1 | 2/2016 | Yoo et al. |
| 2016/0111439 | A1 | 4/2016 | Tsutsumi et al. |
| 2016/0141294 | A1 | 5/2016 | Peri et al. |
| 2016/0204117 | A1 | 7/2016 | Liu et al. |
| 2016/0268209 | A1 | 9/2016 | Pachamuthu et al. |
| 2016/0322381 | A1* | 11/2016 | Liu ................... H01L 27/11573 |
| 2017/0062454 | A1* | 3/2017 | Lu .................... H01L 27/11582 |

FOREIGN PATENT DOCUMENTS

| | | |
|---|---|---|
| WO | WO2008/118433 A1 | 10/2008 |
| WO | WO2009/085078 A1 | 7/2009 |
| WO | WO2012/003301 A2 | 1/2012 |
| WO | WO2015/126664 A1 | 8/2015 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M. "3D Cells Make Terabit NAND Flash Possible," Nikkei Electronics Asia, Sep. 17, 2009, 6pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

(56) References Cited

OTHER PUBLICATIONS

Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkelbp.co.ip/english/NEWS_EN/20090619/171977/ Nikkei Microdevices, Tech-On, Jun. 19, 2009.
Li, W. et al., "Sacrificial Polymers for Nanofluidic Channels in Biological Applications", Nanotechnology 14 (2003) 578-583.
Invitation to Pay Additional Search Fees, International Application No. PCT/US13/24638, dated Apr. 24, 2013.
Non-Final Office for U.S. Appl. No. 13/933,743, Office Action dated Apr. 21, 2014, 29pgs.
Search Report and Written Opinion PCT/US2014/020290, dated Jun. 25, 2014, 10 pages.
Search Report and Written Opinion of PCT/US2014/023276, dated Jun. 30, 2014, 13 pages.
Invitation to Pay Additional Fees and Annex Partial International Search Report for PCT/US2015/015155, dated May 25, 2015, 8 Sheets.
Invitation to Pay Additional Fees and Communication Relating to the Results of the Partial International Search for PCT/US2016/025409, dated Jun. 13, 2016, 7 pages.
International Search Report and the Written Opinion, PCT/US2016/025409, dated Aug. 10, 2016, 16 pages.
Wong, M. et al., "Wafer Temperature Dependence of the Vapor-Phase HF Oxide Etch," J. Electrochem., Soc., vol. 140, No. 1, pp. 205-208, (1993).
U.S. Appl. No. 14/834,830, filed Aug. 25, 2015, SanDisk Technologies LLC.
U.S. Appl. No. 14/834,943, filed Aug. 25, 2015, SanDisk Technologies LLC.
U.S. Appl. No. 14/862,916, filed Sep. 23, 2015, SanDisk Technologies LLC.
U.S. Appl. No. 14/883,966, filed Oct. 15, 2015, SanDisk Technologies LLC.
U.S. Appl. No. 14/927,708, filed Oct. 30, 2015, SanDisk Technologies LLC.
U.S. Appl. No. 14/927,990, filed Oct. 30, 2015, SanDisk Technologies LLC.
U.S. Appl. No. 14/989,206, filed Jan. 6, 2016, SanDisk Technologies LLC.
U.S. Appl. No. 15/015,190, filed Feb. 4, 2016, SanDisk Technologies LLC.
U.S. Appl. No. 15/071,575, filed Mar. 16, 2016, SanDisk Technologies LLC.
U.S. Appl. No. 15/183,195, filed Jun. 15, 2016, SanDisk Technologies LLC.
U.S. Appl. No. 15/186,768, filed Jun. 20, 2016, SanDisk Technologies LLC.
U.S. Appl. No. 15/198,175, filed Jun. 30, 2016, SanDisk Technologies LLC.
U.S. Appl. No. 15/226,132, filed Aug. 2, 2016, SanDisk Technologies LLC.
U.S. Appl. No. 15/243,260, filed Aug. 22, 2016, SanDisk Technologies LLC.
U.S. Appl. No. 15/296,380, filed Oct. 18, 2016, SanDisk Technologies LLC.
U.S. Appl. No. 62/154,916, filed Apr. 30, 2015, SanDisk Technologies LLC.

\* cited by examiner

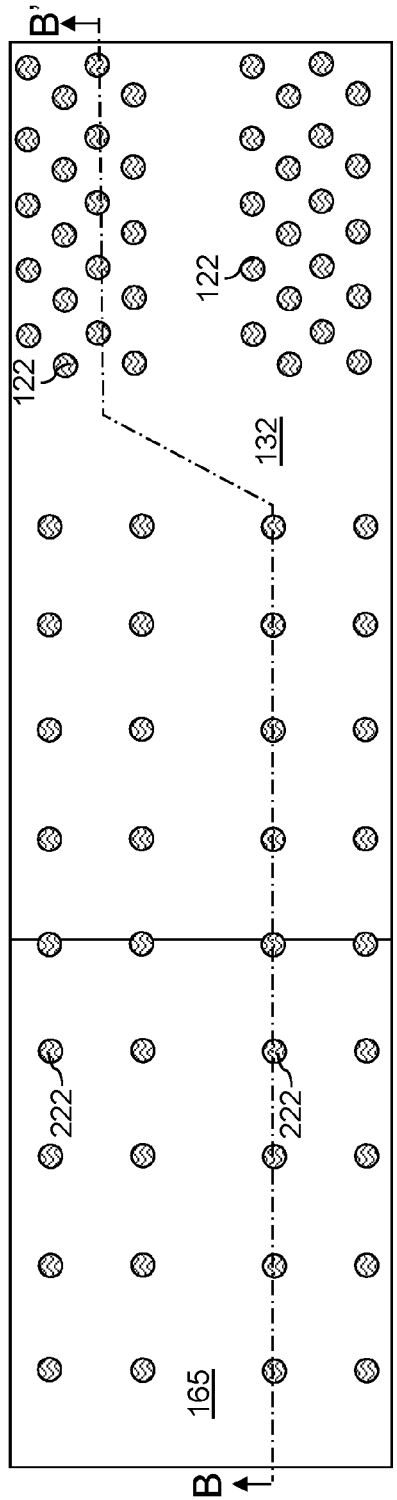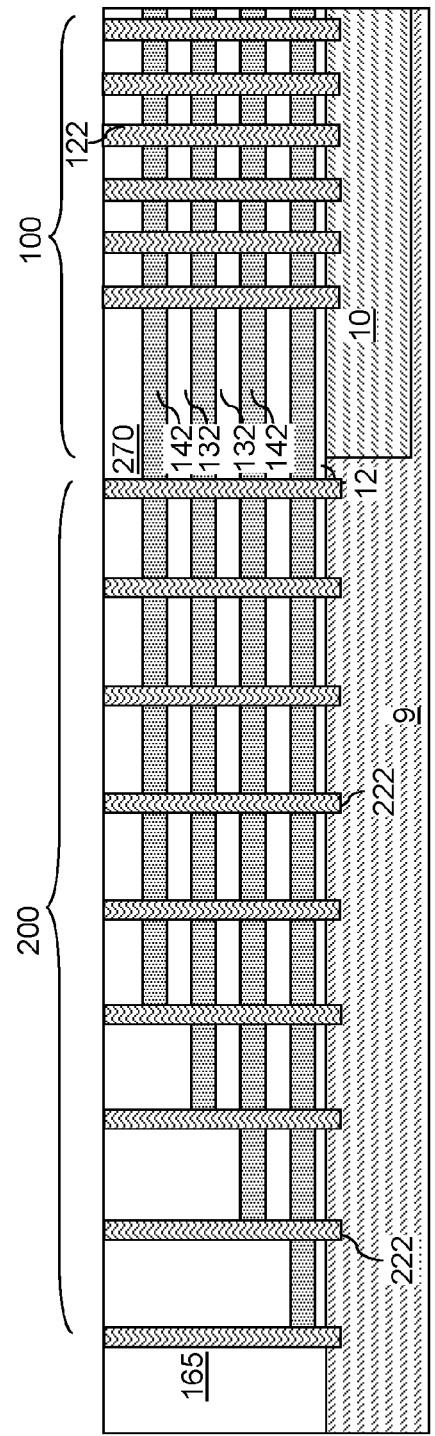
FIG. 4A
FIG. 4B

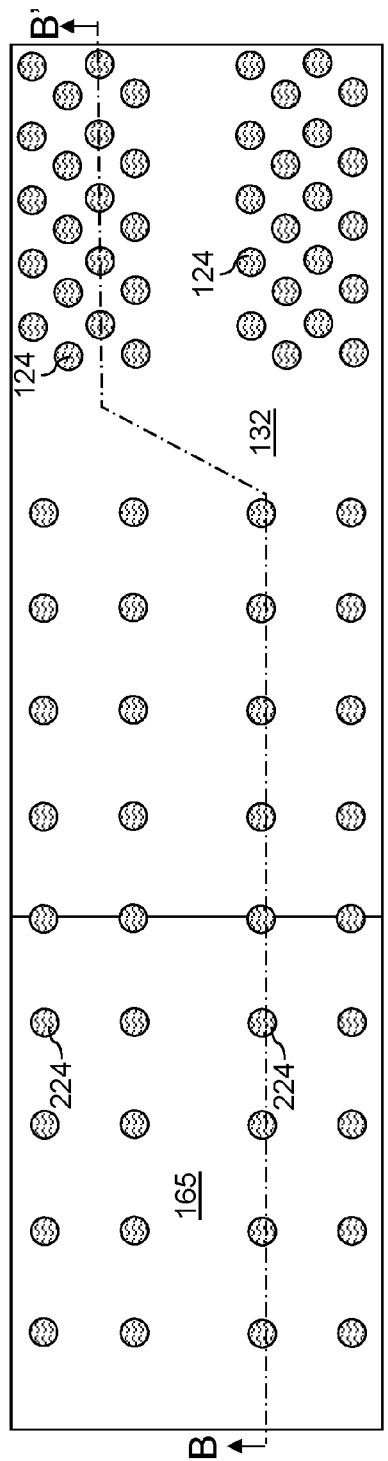
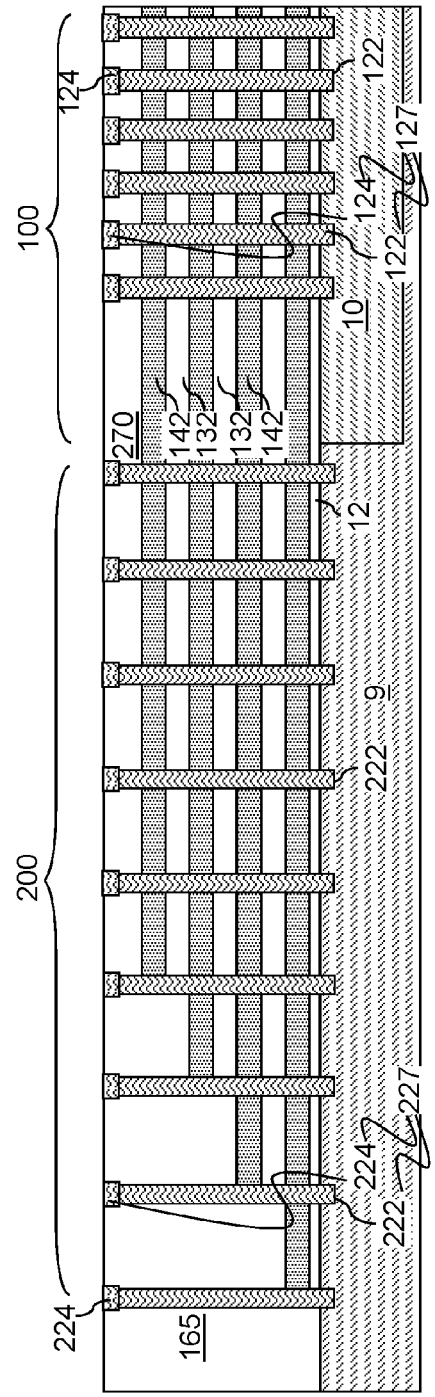
FIG. 6A
FIG. 6B

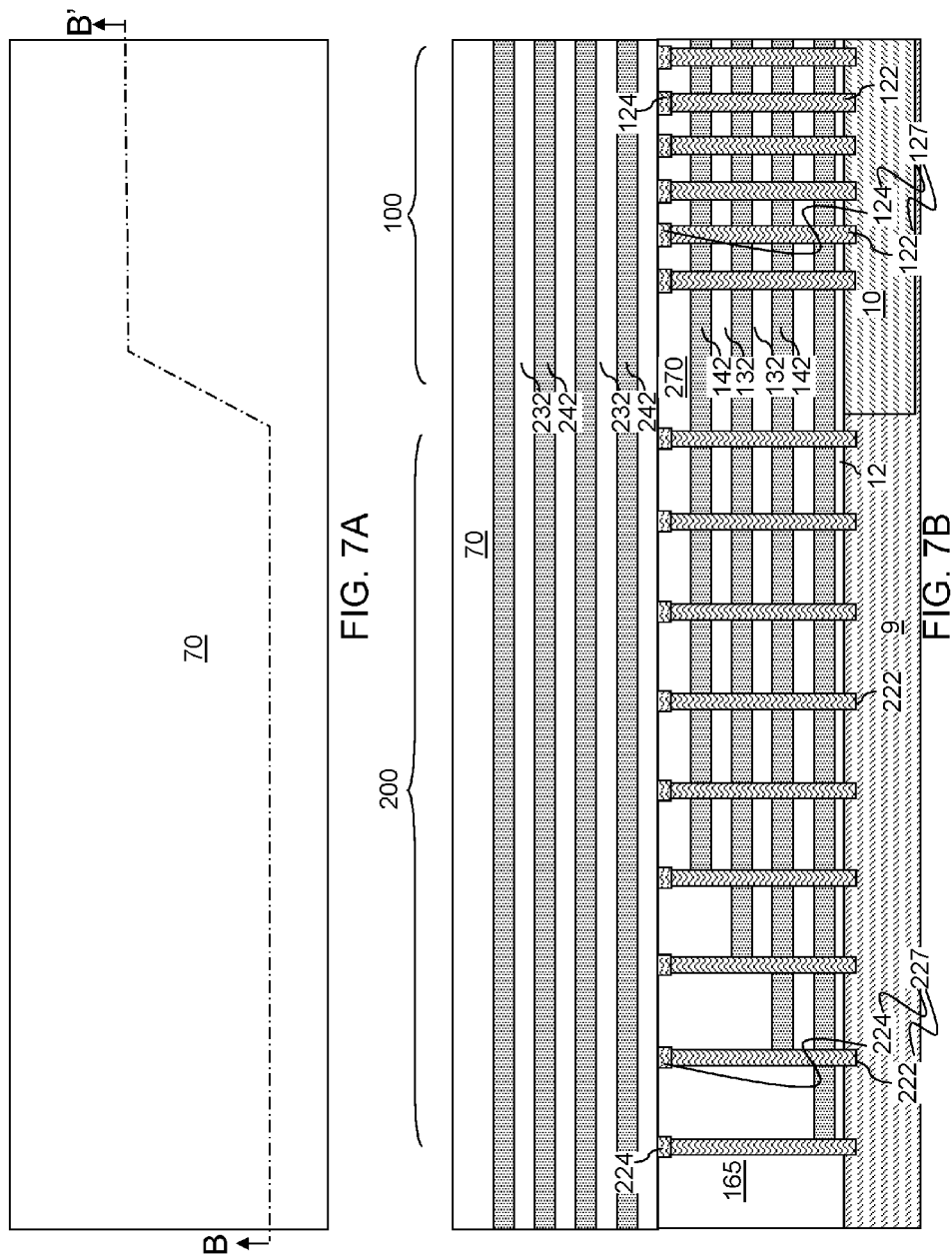

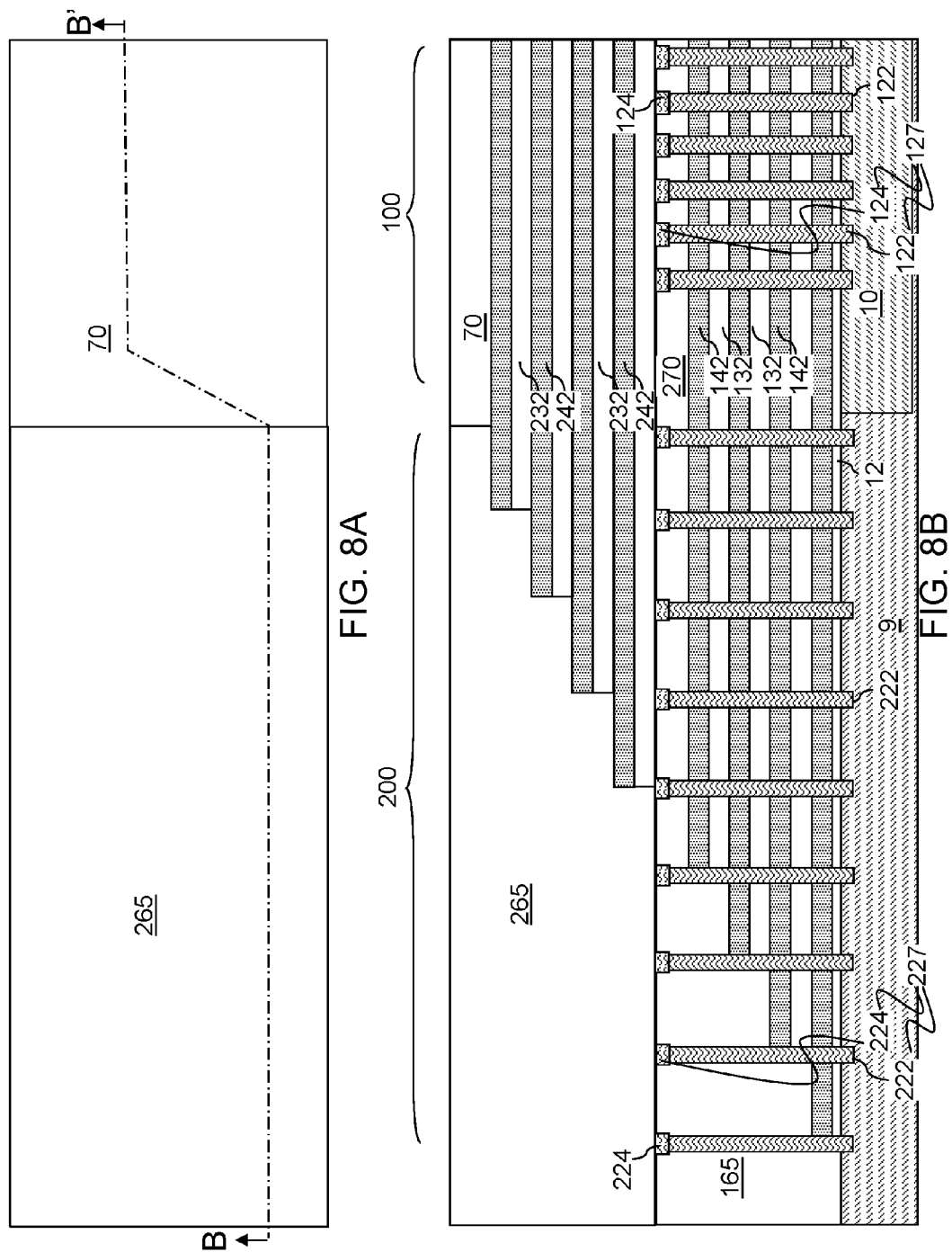

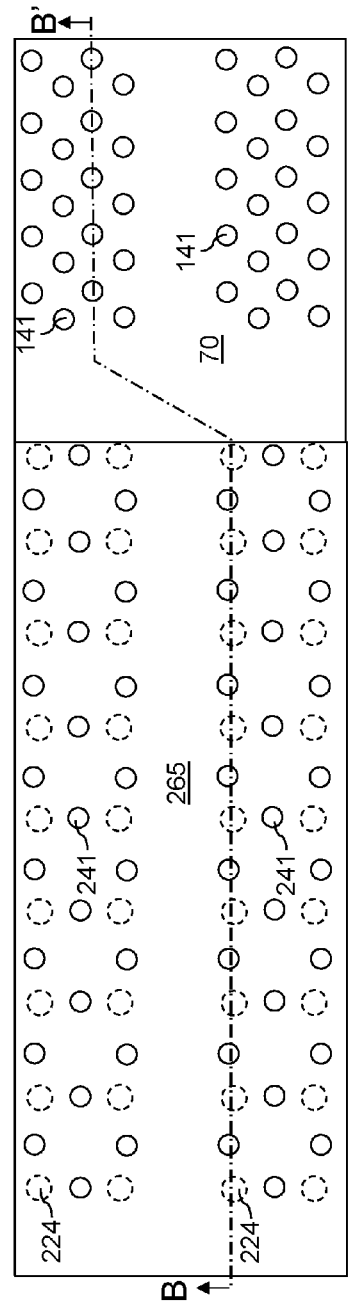
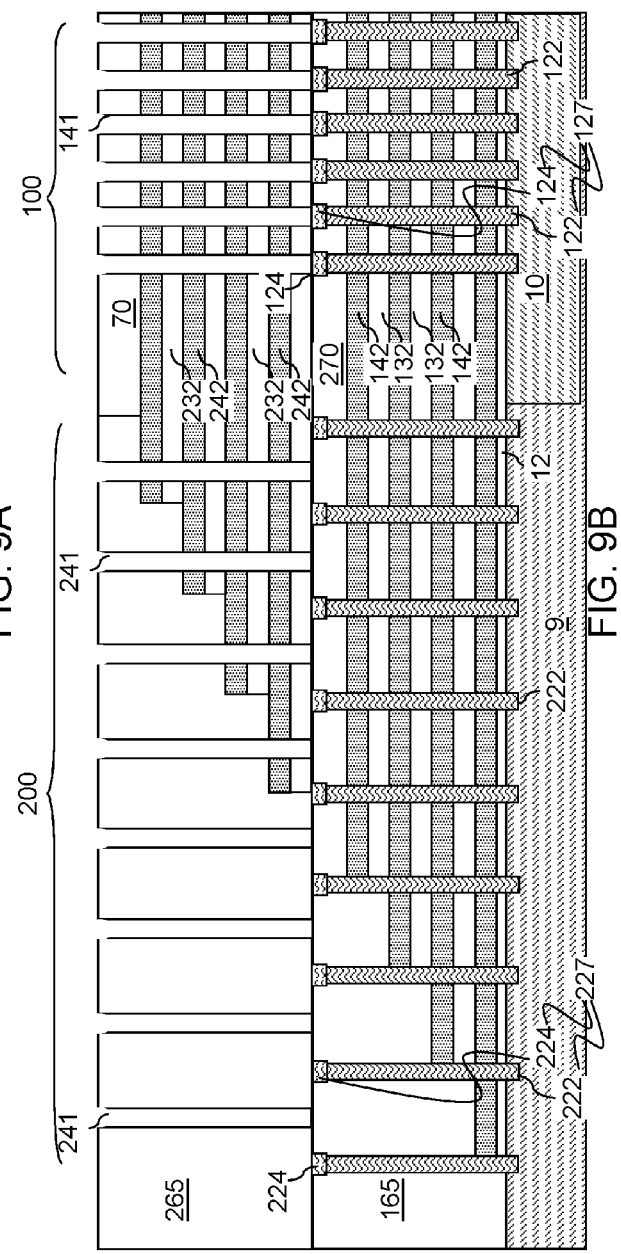
FIG. 9A
FIG. 9B

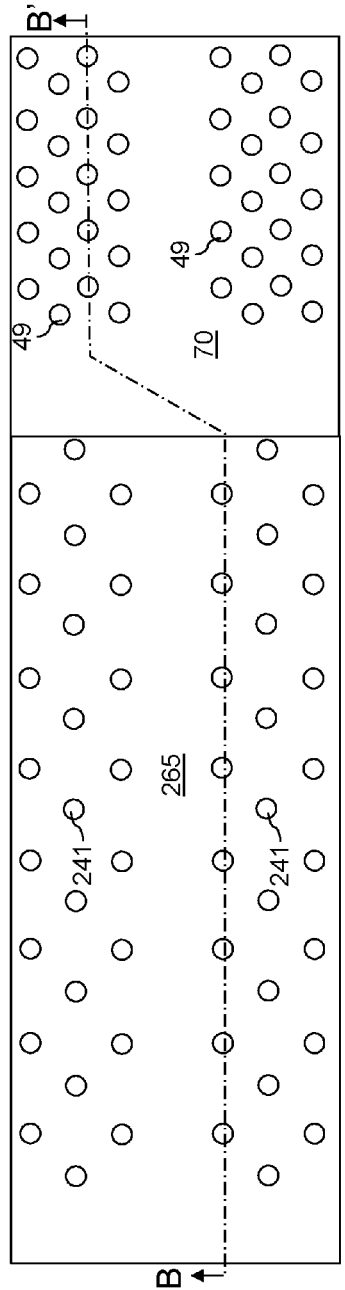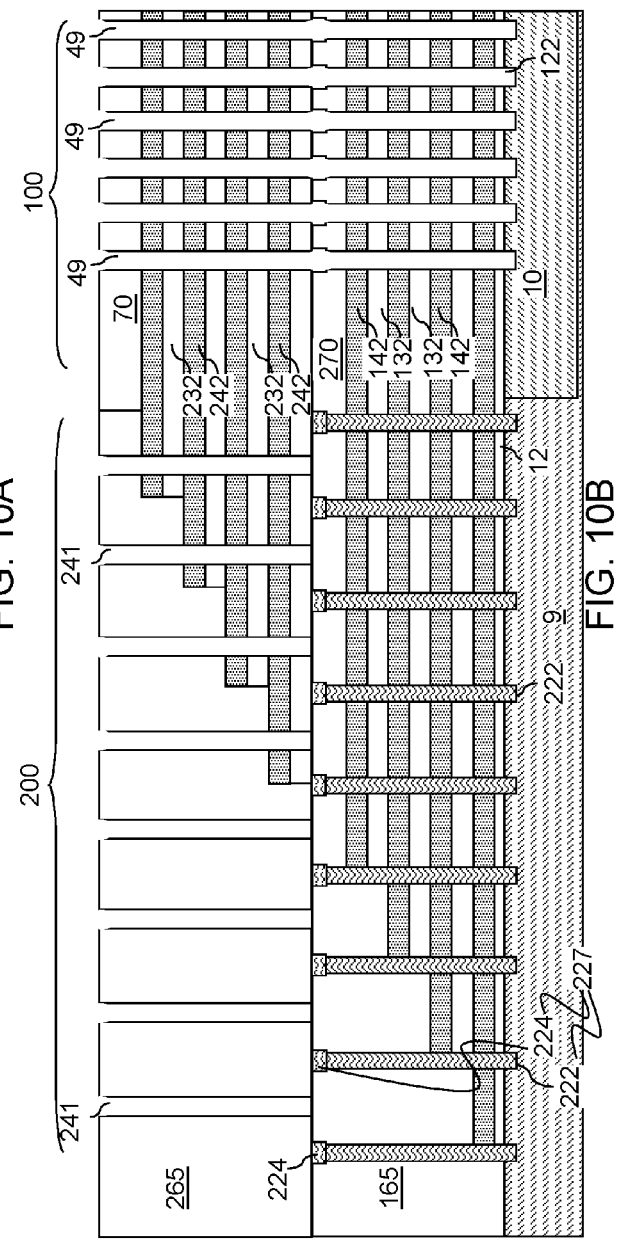
FIG. 10A
FIG. 10B

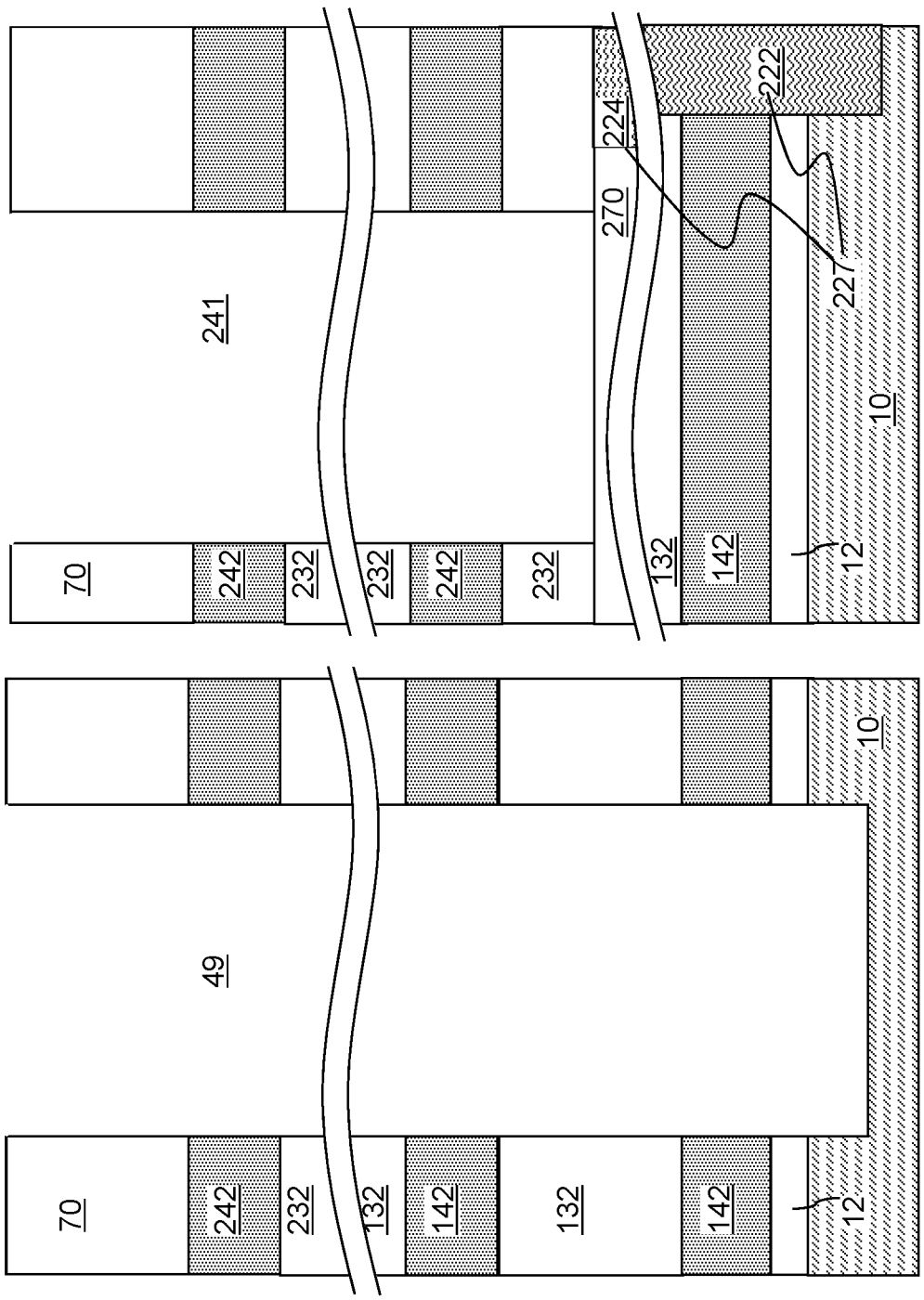

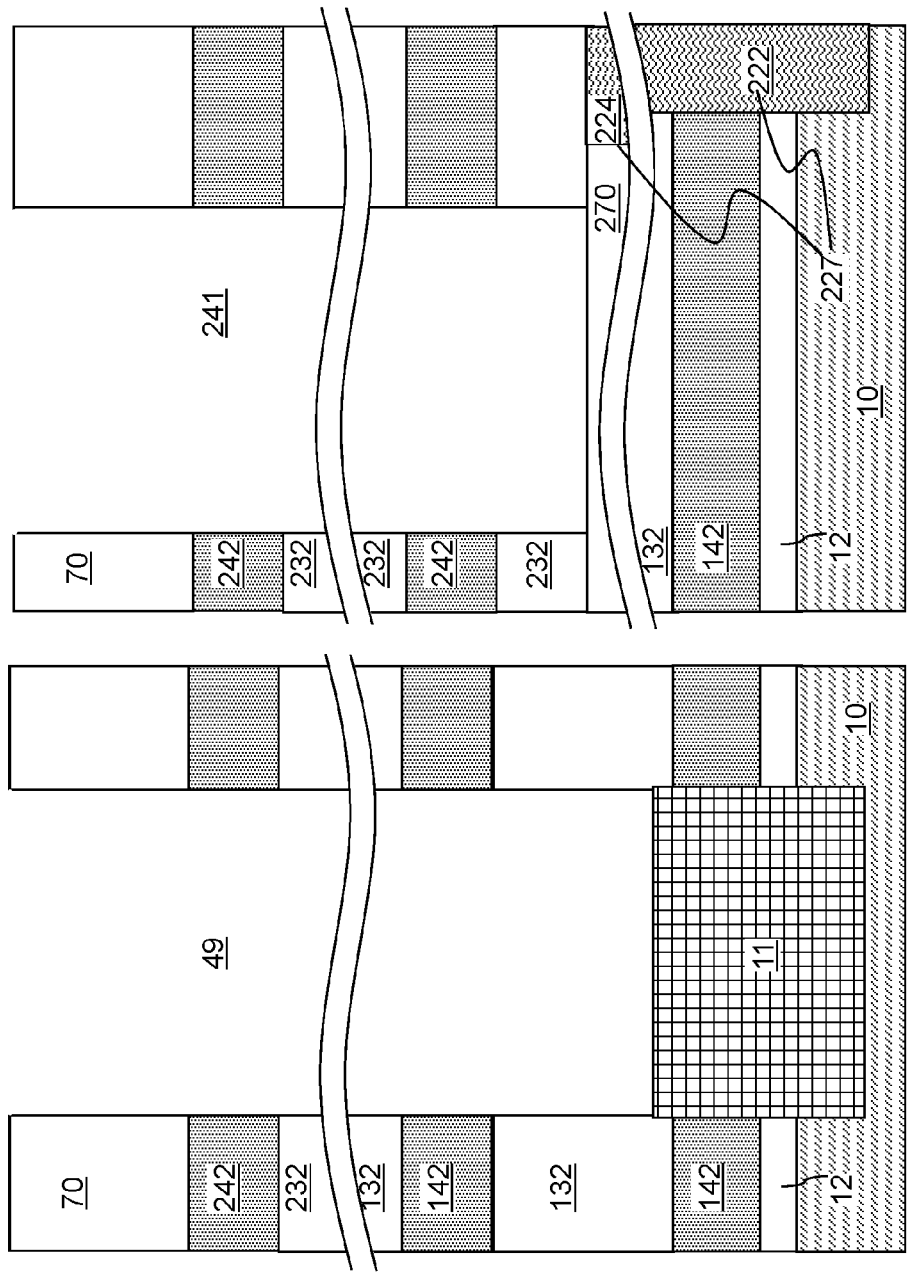

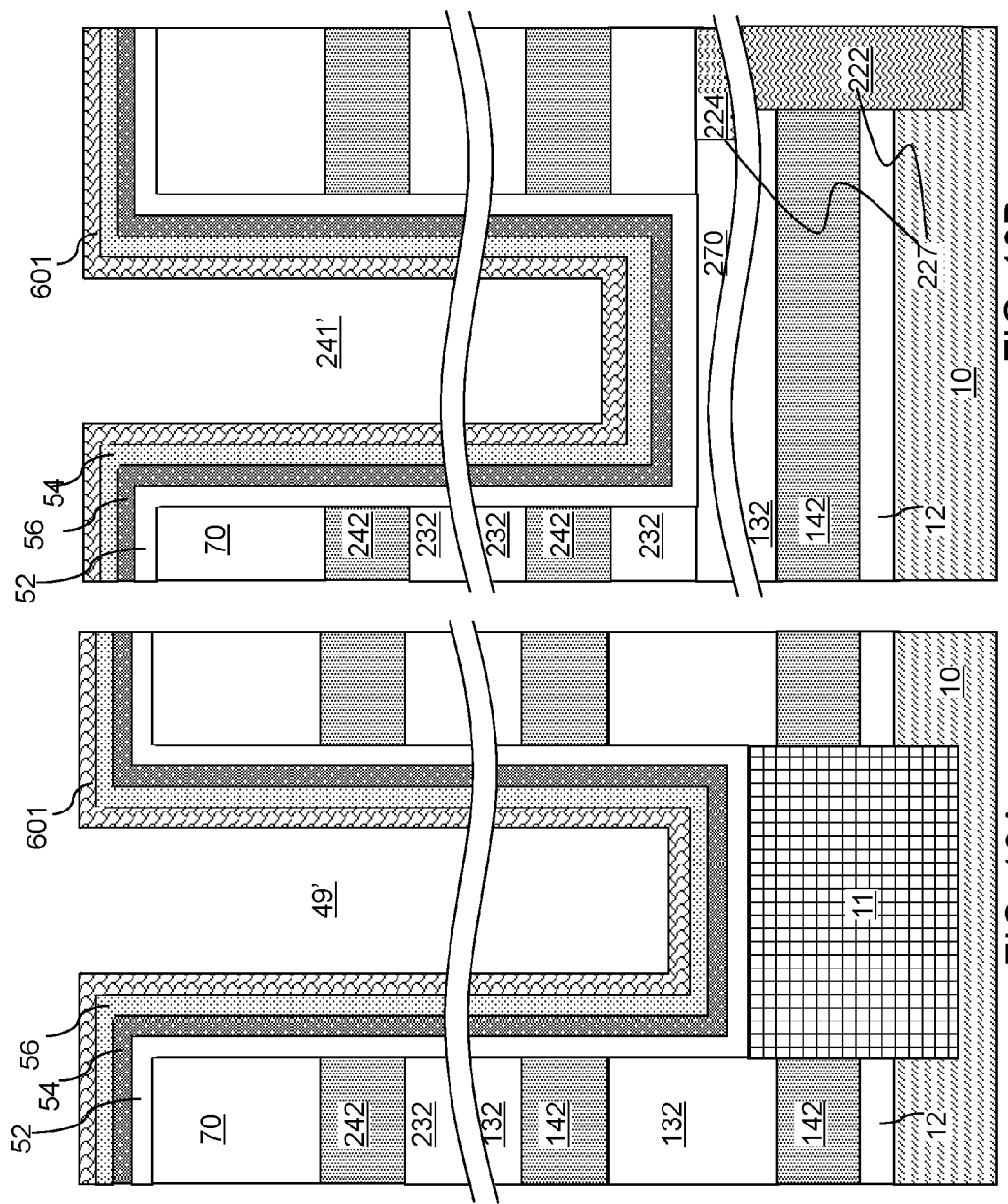

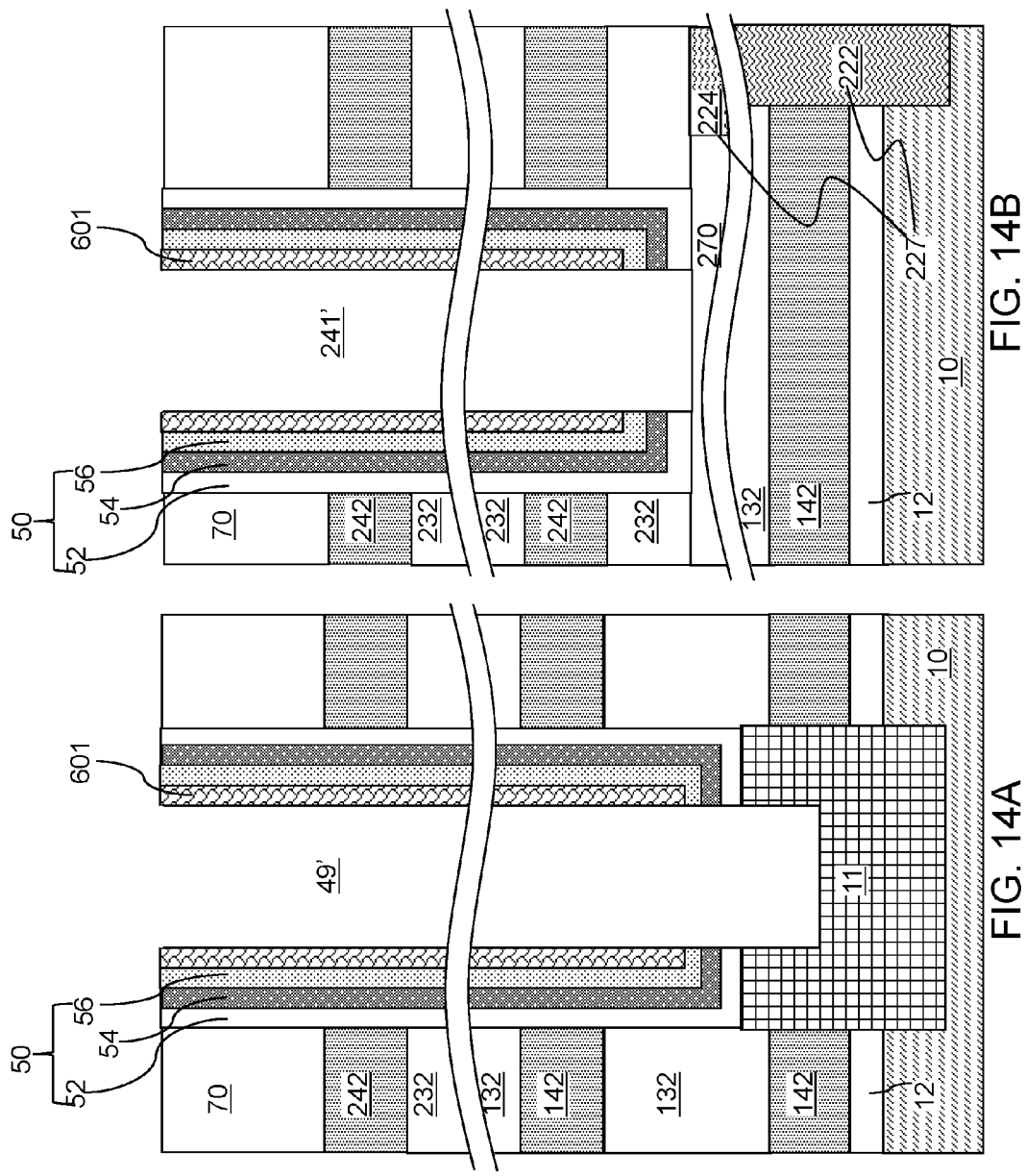

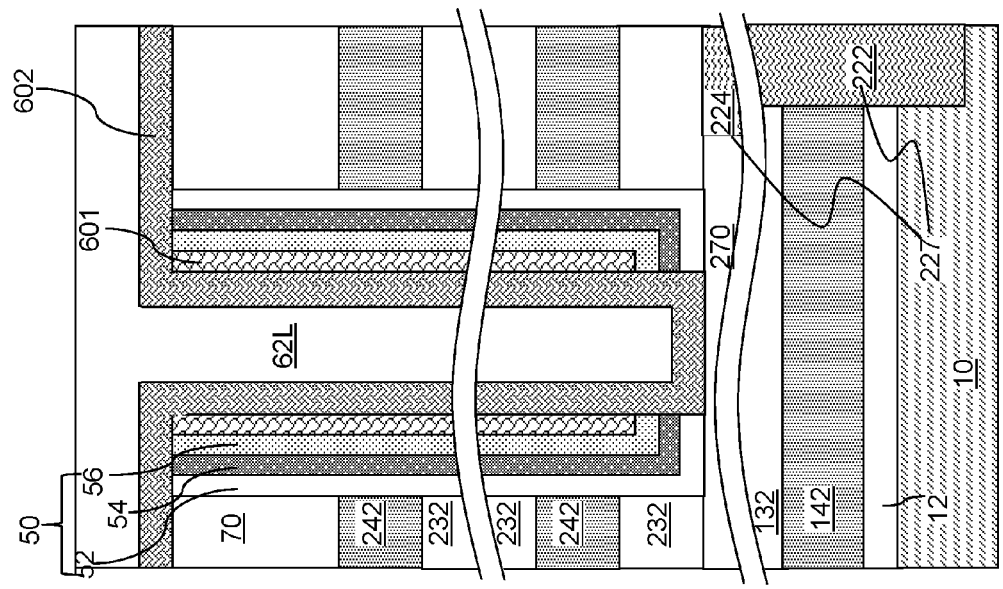
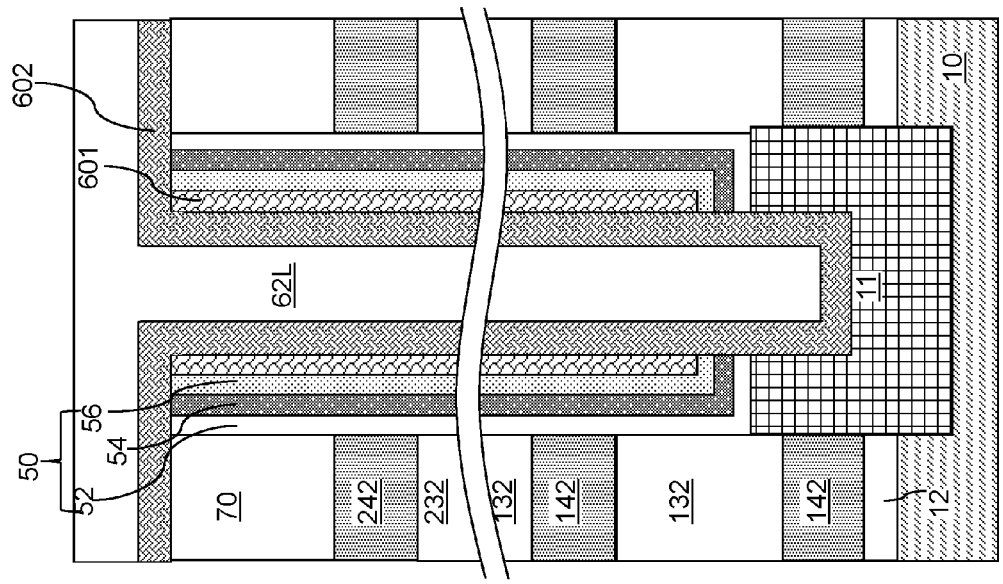

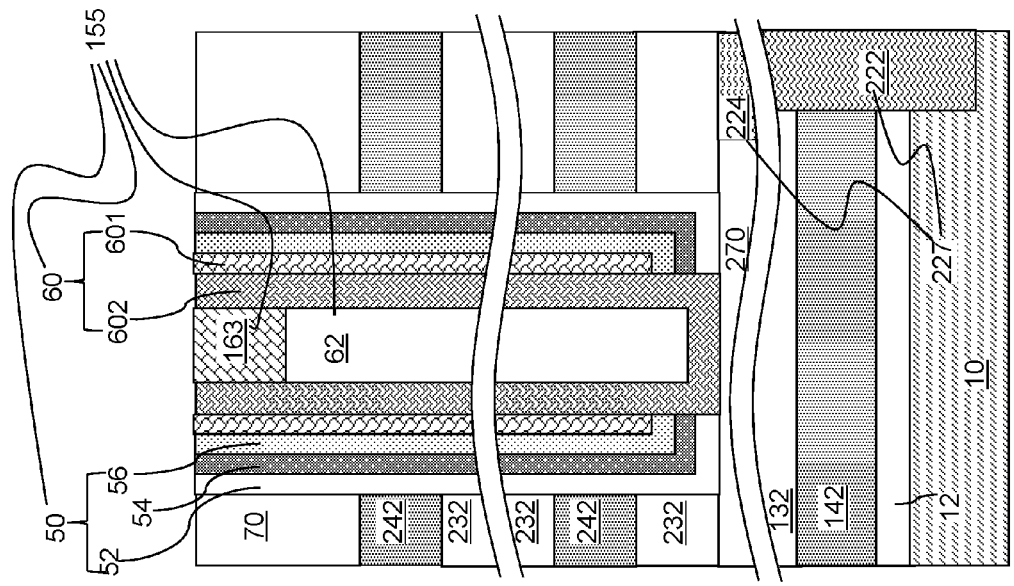
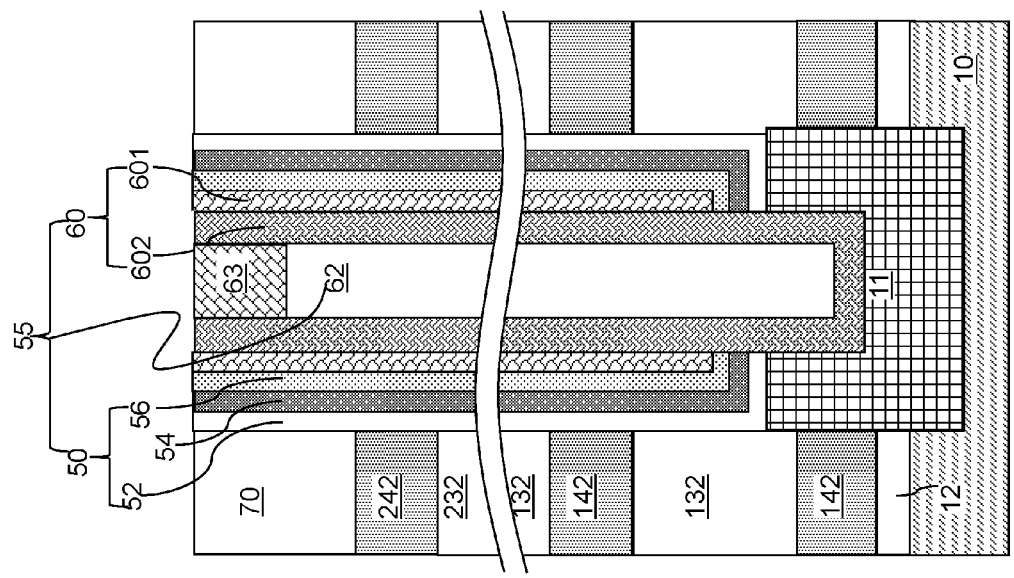

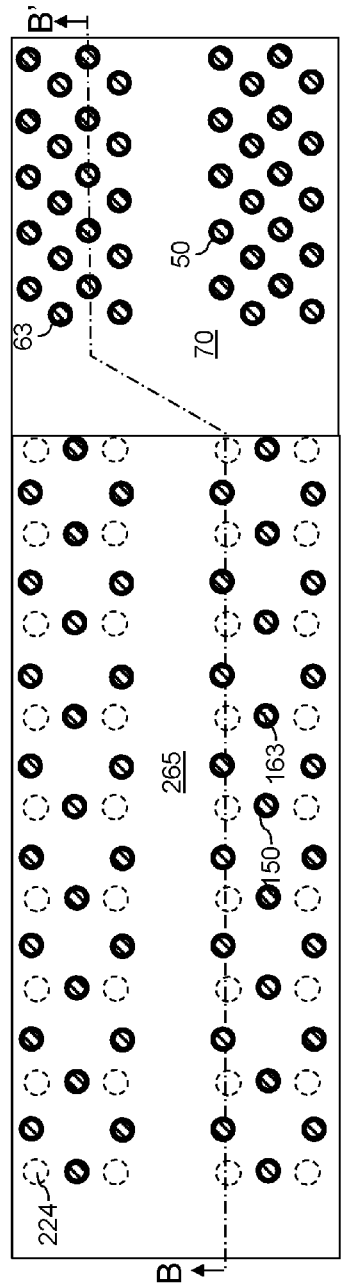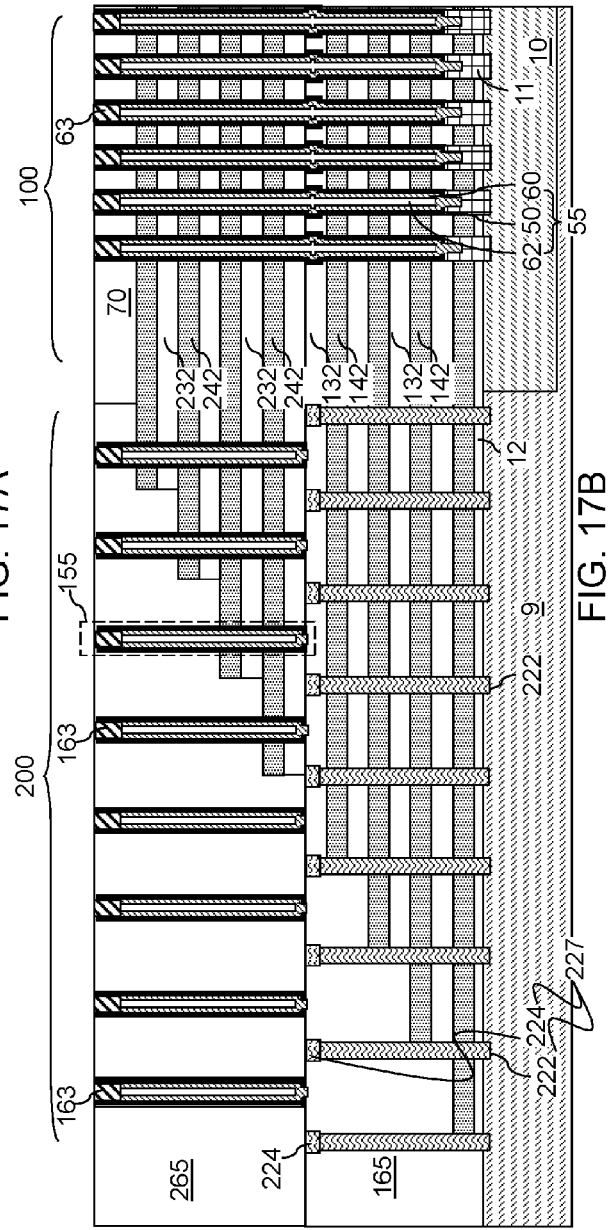
FIG. 17A
FIG. 17B

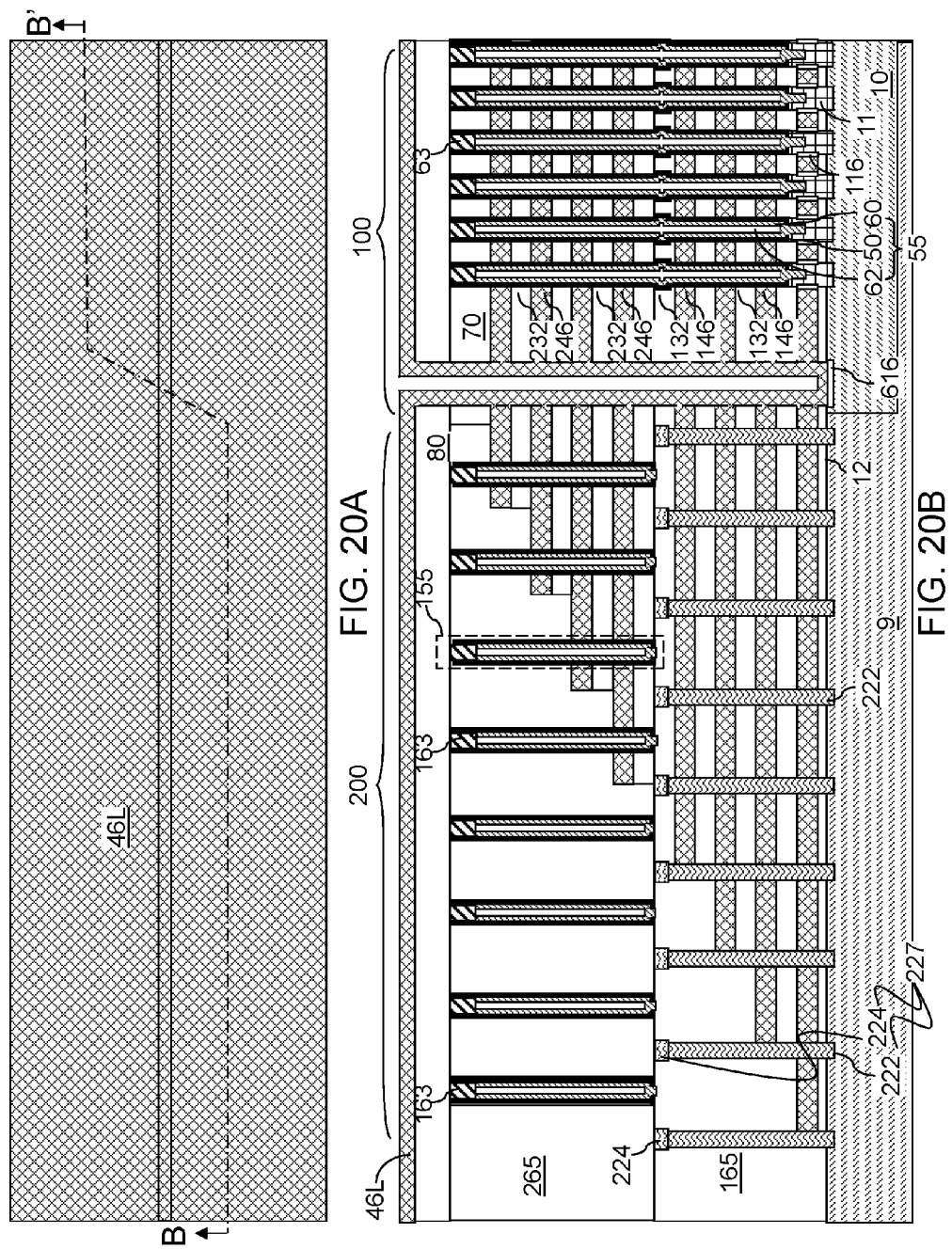

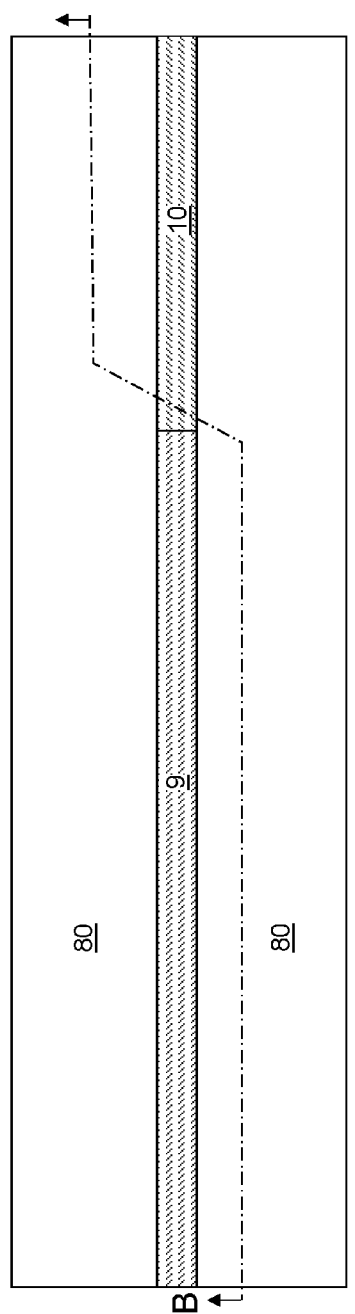
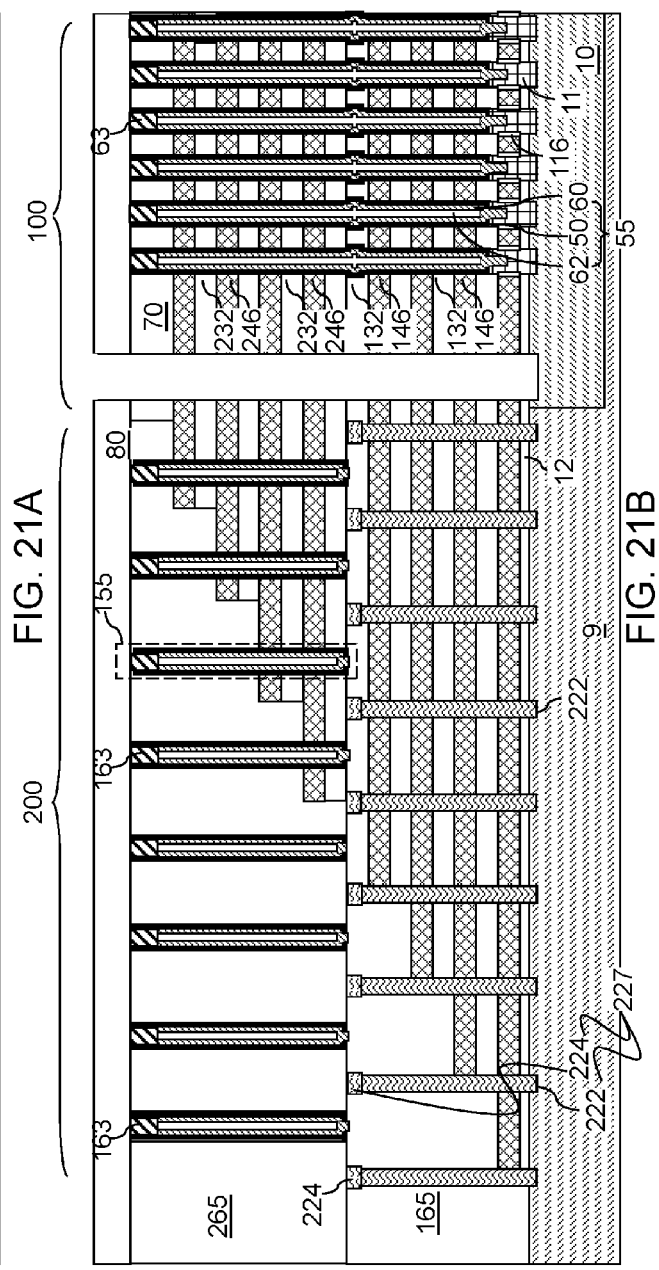
FIG. 21A
FIG. 21B

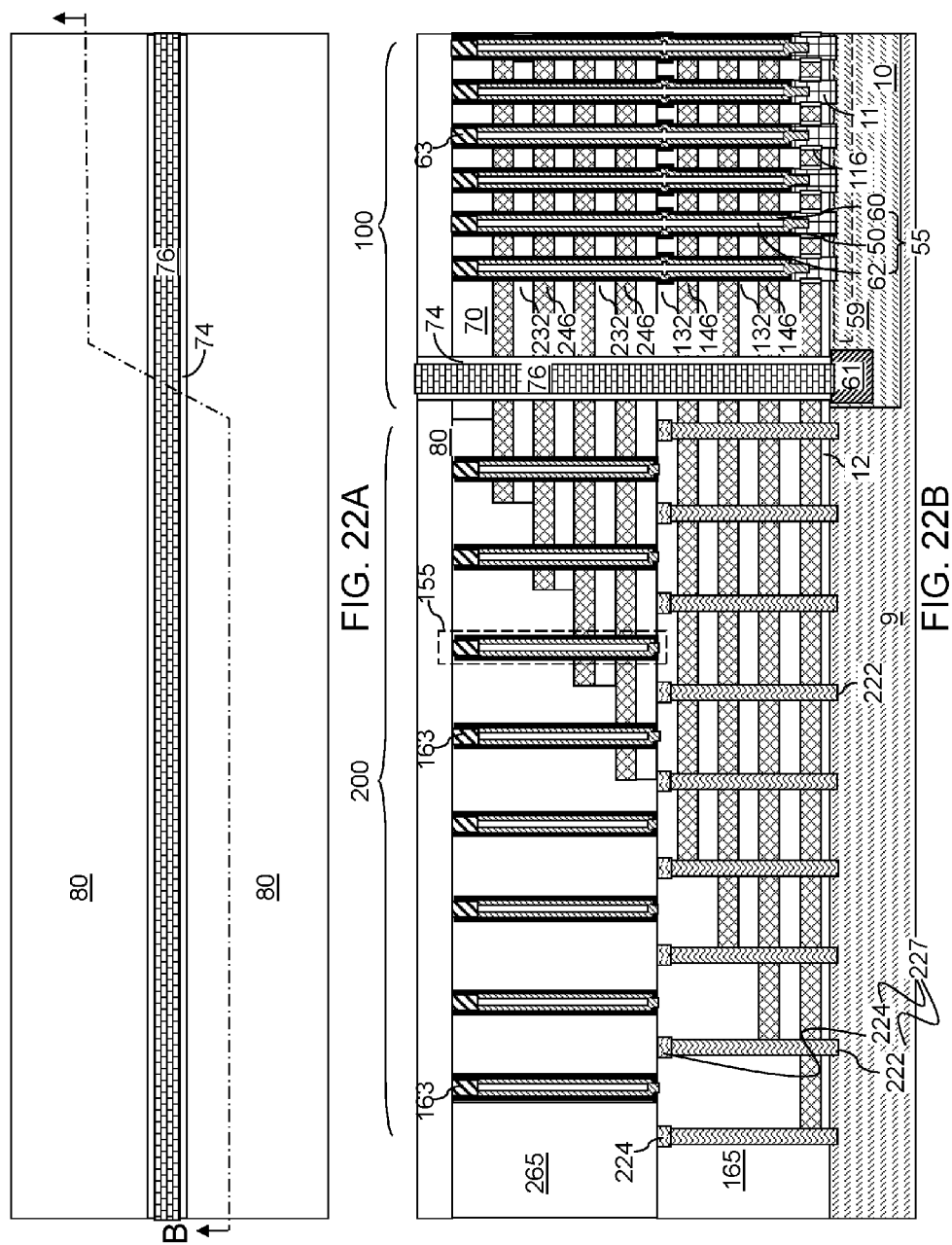

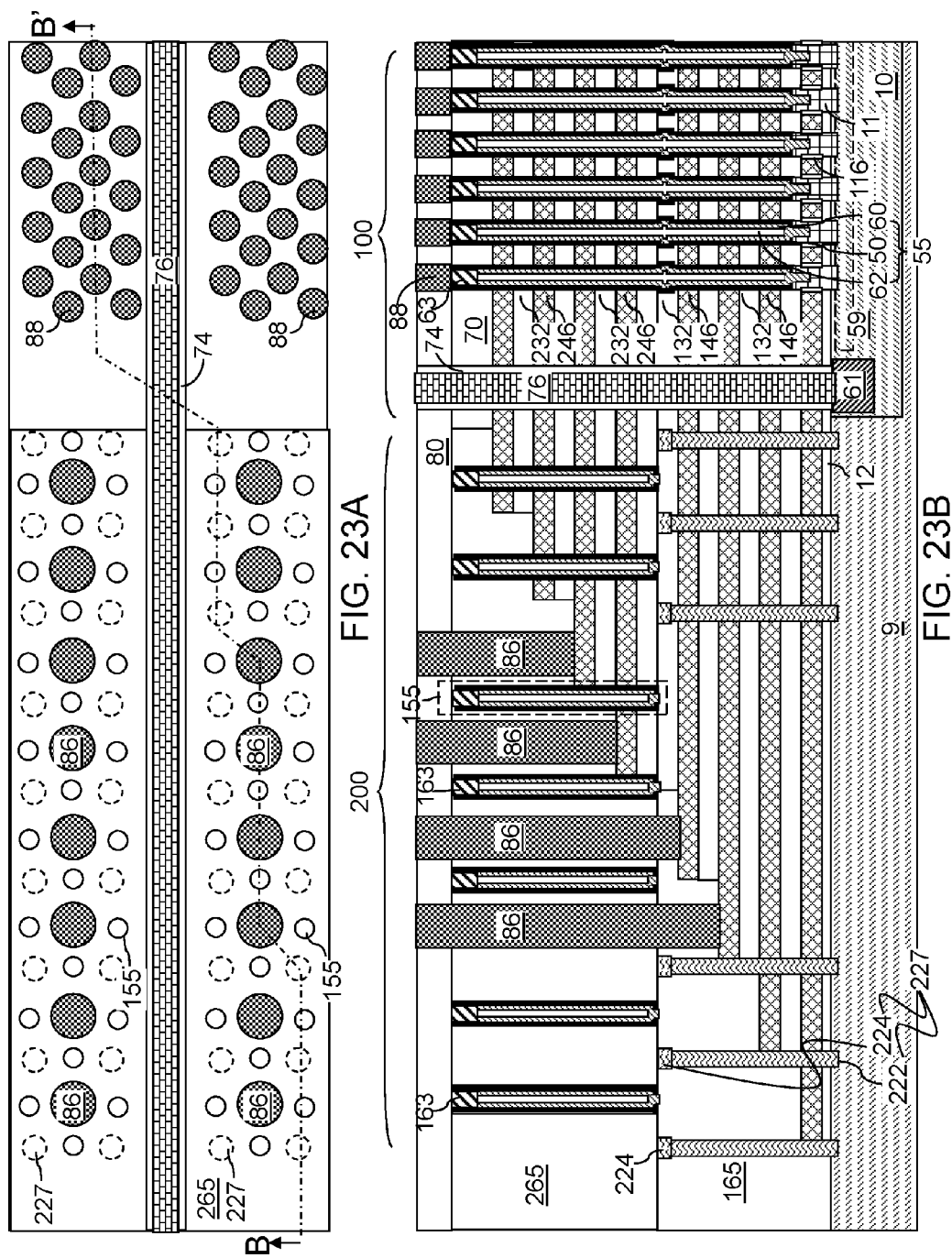

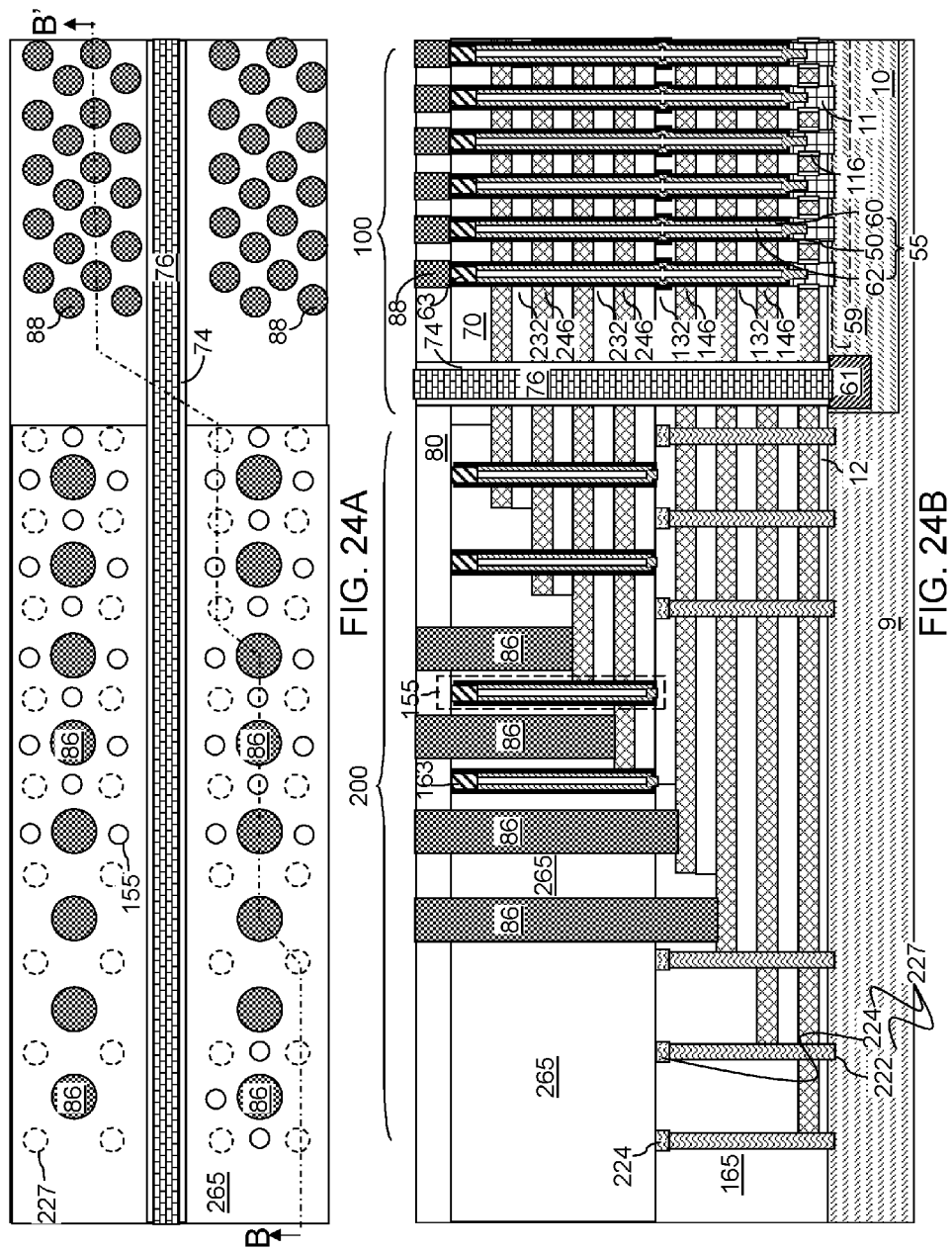

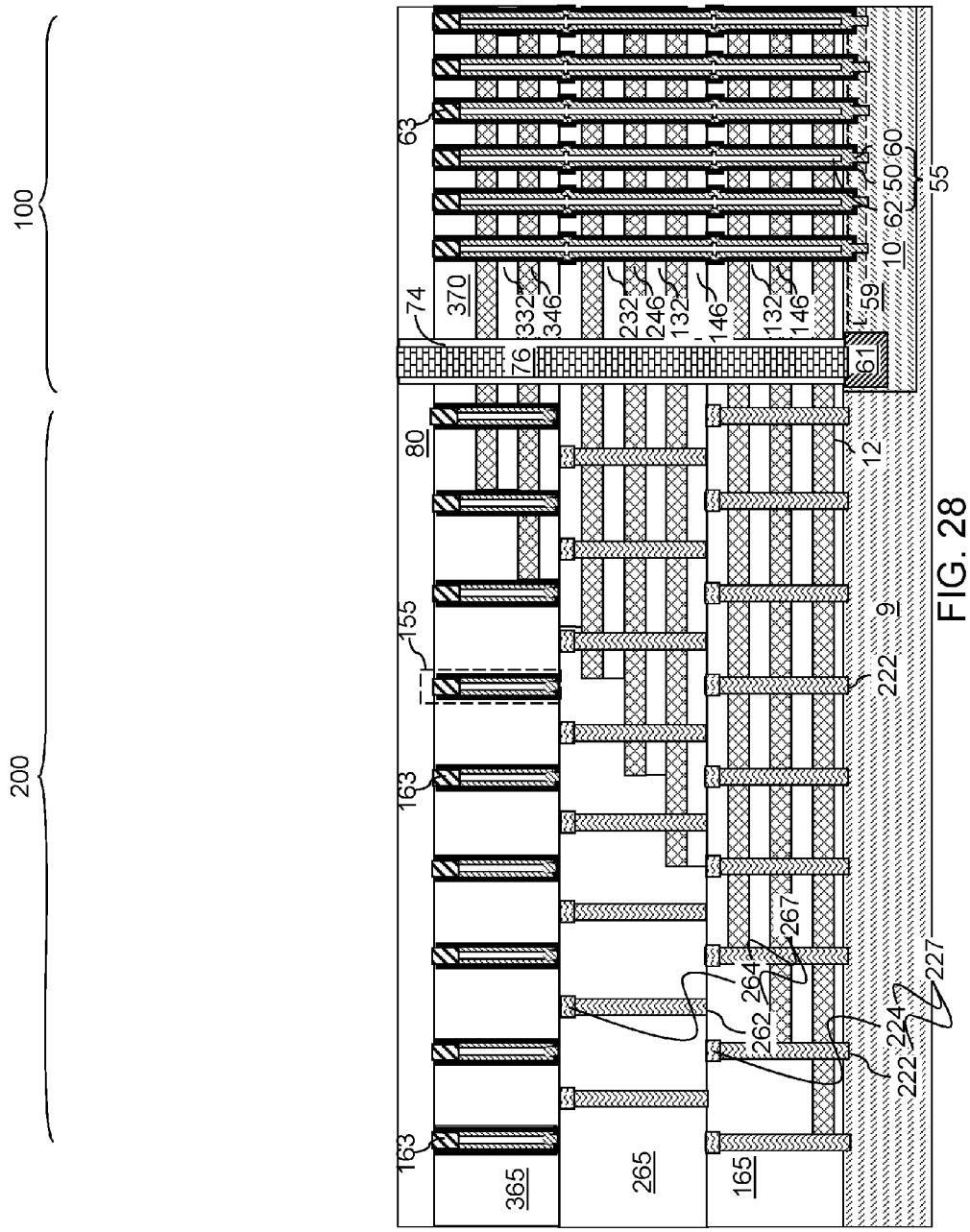

MULTI-TIER MEMORY STACK STRUCTURE CONTAINING NON-OVERLAPPING SUPPORT PILLAR STRUCTURES AND METHOD OF MAKING THEREOF

FIELD

The present disclosure relates generally to the field of three-dimensional memory devices and specifically to multi-tier three-dimensional memory devices employing non-overlapping support pillar structures and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: a first tier structure comprising a first alternating stack of first insulating layers and first electrically conductive layers located over a substrate; a second tier structure comprising a second alternating stack of second insulating layers and second electrically conductive layers located over the first tier structure; a plurality of memory stack structures extending through the first tier structure and the second tier structure; first support pillar structures extending through the first tier structure but not through the second tier structure; and second support pillar structures extending through the second tier structure but not through the first alternating stack. In one embodiment, the second support pillar structures are not in physical contact with any of the first support pillar structures. In another embodiment, the second support pillar structures do not overlap with any of the first support pillar structures. In yet another embodiment, the second support pillar structures are not in physical contact with any of the first support pillar structures and do not overlap with any of the first support pillar structures.

According to another aspect of the present disclosure, a method of forming a three-dimensional memory device is provided. A first tier structure is formed over a substrate. The first tier structure comprises a first alternating stack of first insulating layers and first sacrificial material layers. First support openings and first memory openings are formed through the first tier structure. At least one fill material is deposited within the first support openings to form first support pillar structures. A second tier structure comprising a second alternating stack of second insulating layers and second sacrificial material layers is formed over the first tier structure. Second support openings are formed through the second tier structure. Each of the second support openings is laterally spaced from the first support pillar structures. Memory stack structures extending through the first tier structure and the second tier structure are formed. Each of the memory stack structures comprises a memory film and a semiconductor channel. Second support pillar structures are formed in the second support openings. The first and second sacrificial material layers are replaced with first and second electrically conductive layers while the first support pillar structures, the second support pillar structures, and the memory stack structures provide structural support to the first and second insulating layers.

BRIEF DESCRIPTION OF THE DRAWINGS

FIG. 4A is a top-down view of the first exemplary structure after formation of first fill material portions in the first support openings and in the first memory openings according to an embodiment of the present disclosure.

FIG. 4B is a vertical cross-sectional view of the first exemplary structure of FIG. 4A along the vertical plane B-B'.

FIG. 6A is a top-down view of the first exemplary structure after forming second fill material portions in top regions of the first support openings and the first memory openings according to an embodiment of the present disclosure.

FIG. 6B is a vertical cross-sectional view of the first exemplary structure of FIG. 6A along the vertical plane B-B'.

FIG. 7A is a top-down view of the first exemplary structure after formation of a second alternating stack of second insulating layers and second sacrificial material layers according to an embodiment of the present disclosure.

FIG. 7B is a vertical cross-sectional view of the first exemplary structure of FIG. 7A along the vertical plane B-B'.

FIG. 8A is a top-down view of the first exemplary structure after formation of second stepped surfaces and a second retro-stepped dielectric material portion according to an embodiment of the present disclosure.

FIG. 8B is a vertical cross-sectional view of the first exemplary structure of FIG. 8A along the vertical plane B-B'.

FIG. 9A is a top-down view of the first exemplary structure after formation of second memory openings and second support openings according to an embodiment of the present disclosure.

FIG. 9B is a vertical cross-sectional view of the first exemplary structure of FIG. 9A along the vertical plane B-B'.

FIG. 10A is a top-down view of the first exemplary structure after formation of inter-tier memory openings according to an embodiment of the present disclosure.

FIG. 10B is a vertical cross-sectional view of the first exemplary structure of FIG. 10A along the vertical plane B-B'.

FIG. 11A is a vertical cross-sectional view of an inter-tier memory opening upon formation thereof according to an embodiment of the present disclosure.

FIG. 11B is a vertical cross-sectional view of a second support opening and a first support opening in proximity to the second support opening at the processing step of FIG. 11A.

FIG. 12A is a vertical cross-sectional view of the inter-tier memory opening after formation of an epitaxial pedestal therein according to an embodiment of the present disclosure.

FIG. 12B is a vertical cross-sectional view of the second support opening and the first support opening in proximity to the second support opening at the processing step of FIG. 12A.

FIG. 13A is a vertical cross-sectional view of the inter-tier memory opening after formation of material layers for forming a memory film and a first semiconductor channel layer according to an embodiment of the present disclosure.

FIG. 13B is a vertical cross-sectional view of the second support opening and the first support opening in proximity to the second support opening at the processing step of FIG. 13A.

FIG. 14A is a vertical cross-sectional view of the inter-tier memory opening after formation of a memory film by an anisotropic etch according to an embodiment of the present disclosure.

FIG. 14B is a vertical cross-sectional view of the second support opening and the first support opening in proximity to the second support opening at the processing step of FIG. 14A.

FIG. 15A is a vertical cross-sectional view of the inter-tier memory opening after formation of a second semiconductor channel layer and a dielectric core material layer according to an embodiment of the present disclosure.

FIG. 15B is a vertical cross-sectional view of the second support opening and the first support opening in proximity to the second support opening at the processing step of FIG. 15A.

FIG. 16A is a vertical cross-sectional view of the inter-tier memory opening after formation of a dielectric core and a drain region according to an embodiment of the present disclosure.

FIG. 16B is a vertical cross-sectional view of the second support opening and the first support opening in proximity to the second support opening at the processing step of FIG. 16A.

FIG. 17A is a top-down view of the first exemplary structure after formation of memory stack structures, second support pillar structures, drain regions, and dummy drain regions according to an embodiment of the present disclosure.

FIG. 17B is a vertical cross-sectional view of the first exemplary structure of FIG. 17A along the vertical plane B-B'.

FIG. 20A is a top-down view of the first exemplary structure after formation of first and second electrically conductive layers and a continuous conductive material layer according to an embodiment of the present disclosure.

FIG. 20B is a vertical cross-sectional view of the first exemplary structure of FIG. 20A along the vertical plane B-B'.

FIG. 21A is a top-down view of the first exemplary structure after removal of the continuous conductive material layer according to an embodiment of the present disclosure.

FIG. 21B is a vertical cross-sectional view of the first exemplary structure of FIG. 21A along the vertical plane B-B'.

FIG. 22A is a top-down view of the first exemplary structure after formation of an insulating spacer, a source region, and a backside contact via structure according to an embodiment of the present disclosure.

FIG. 22B is a vertical cross-sectional view of the first exemplary structure of FIG. 22A along the vertical plane B-B'.

FIG. 23A is a top-down view of the first exemplary structure after formation of additional contact via structures according to an embodiment of the present disclosure.

FIG. 23B is a vertical cross-sectional view of the first exemplary structure of FIG. 23A along the vertical plane B-B'.

FIG. 24A is a top-down view of an alternative embodiment of the first exemplary structure after formation of additional contact via structures according to an embodiment of the present disclosure.

FIG. 24B is a vertical cross-sectional view of the alternative embodiment of the first exemplary structure of FIG. 23A along the vertical plane B-B'.

FIG. 28 is a vertical cross-sectional view of a second exemplary structure according to a second embodiment of the present disclosure.

DETAILED DESCRIPTION

Figure 1:
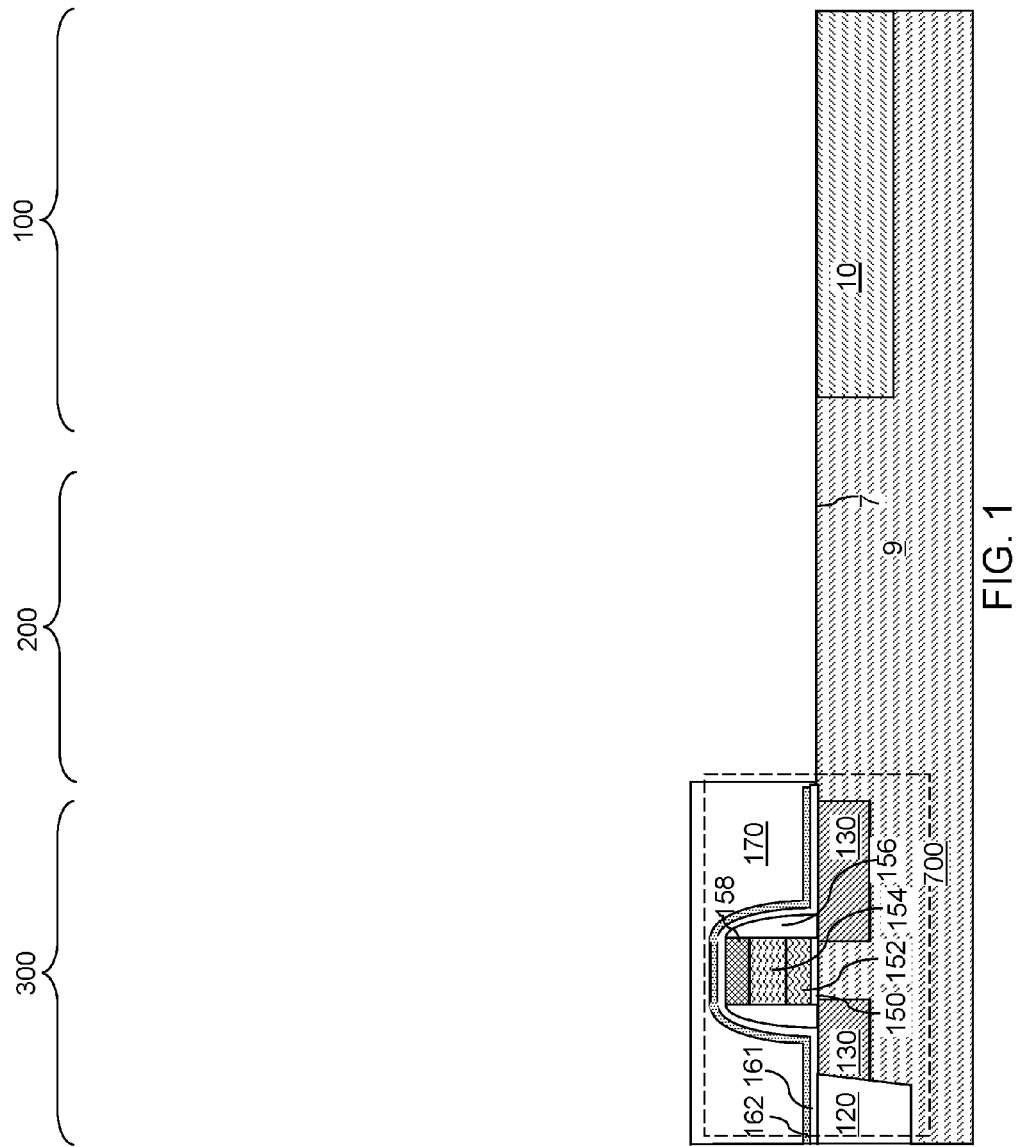
FIG. 1 is a vertical cross-sectional view of a first exemplary structure after formation of at least one peripheral device according to an embodiment of the present disclosure.

As discussed above, the present disclosure is directed to multi-tier three-dimensional memory devices employing non-overlapping support pillar structures and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. Elements with the same reference numeral refer to a same element or a similar element, and are presumed to have the same composition unless explicitly noted otherwise.

As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate, which can be a semiconductor substrate (9, 10). The substrate can include a substrate semiconductor layer 9. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to an electrically conductive material including at least one metal element therein. All measurements for electrical conductivities are made at the standard condition.

At least one semiconductor device 700 for a peripheral circuitry can be formed on a portion of the substrate semiconductor layer 9. Optionally, a portion of the substrate semiconductor layer 9 can be vertically recessed to provide a recessed region, and the at least one semiconductor device 700 may be formed in the recessed region. Alternatively, an additional semiconductor material may be added to the substrate semiconductor layer 9 outside a region of the at least one semiconductor device 700, for example, by selective epitaxy after formation of the at least one semiconductor device.

The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed.

The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9 in regions that do not include the at least one semiconductor device 700.

An optional semiconductor material layer 10 may be formed within, or on top of, the substrate semiconductor layer 9 by ion implantation of electrical dopants (such as p-type dopants or n-type dopants) and/or by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 300. The region in which a memory array is subsequently formed is herein referred to as a memory array region 100. A contact region 200 for subsequently forming stepped terraces of electrically conductive layers can be provided between the memory array region 100 and the peripheral device region 300.

Figure 2A:
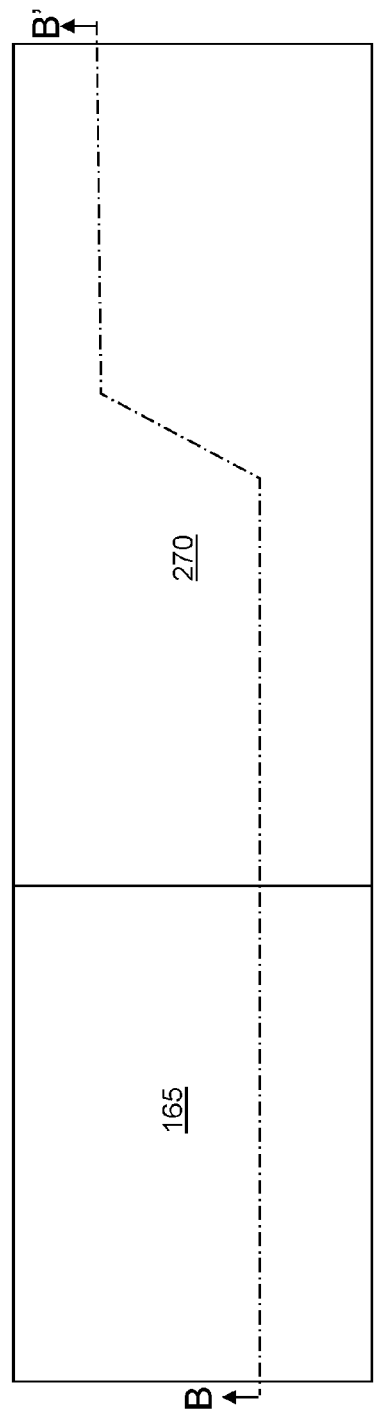
FIG. 2A is a top-down view of the first exemplary structure after formation of a first alternating stack of first insulating layers and first sacrificial material layers, first stepped surfaces, and a first retro-stepped dielectric material portion according to an embodiment of the present disclosure.
Figure 2B:
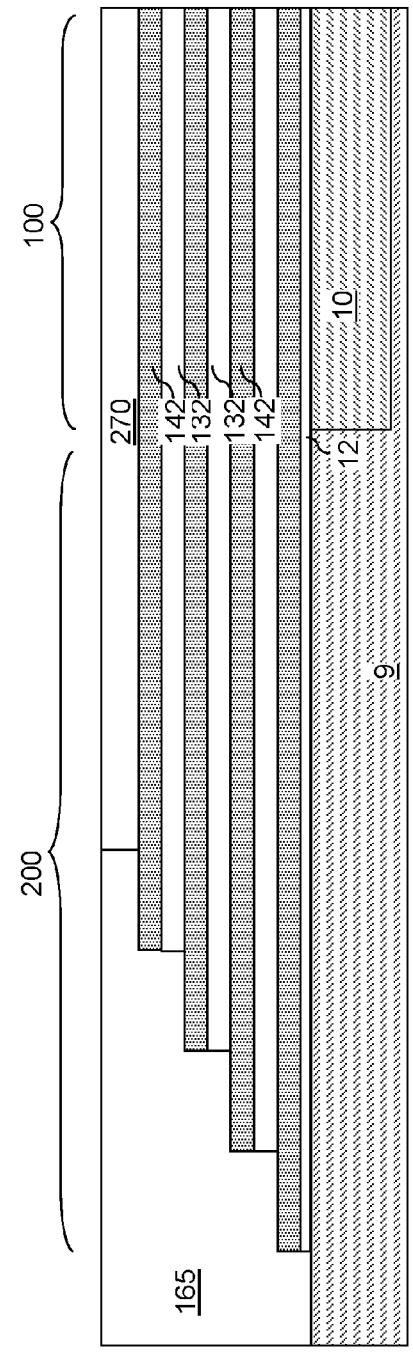
FIG. 2B is a vertical cross-sectional view of the first exemplary structure of FIG. 2A along the vertical plane B-B'.

Referring to FIGS. 2A and 2B, a gate dielectric layer 12 can be optionally formed above the semiconductor material layer 10 and the planarization dielectric layer 170. The gate dielectric layer 12 can include, for example, a silicon oxide layer and/or a dielectric metal oxide layer (such as an aluminum oxide layer and/or a hafnium oxide layer). The thickness of the gate dielectric layer 12 can be in a range from 3 nm to 30 nm, although lesser and greater thicknesses can also be employed.

An alternating stack of first material layers and second material layers is subsequently formed. Each first material layer can include a first material, and each second material layer can include a second material that is different from the first material. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. The alternating stack formed by the first insulating layers 132 and the first sacrificial material layers 142 is herein referred to as a first alternating stack (132, 142), or a lower alternating stack (132, 142). In this case, the stack can include an alternating plurality of first insulating layers 132 and first sacrificial material layers 142. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride or a semiconductor material including at least one of silicon and germanium.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

A first-tier dielectric cap layer 270 can be subsequently formed over the first alternating stack (132, 142). The first-tier dielectric cap layer 270 includes a dielectric material that is different from the material of the first sacrificial material layers 142. The first-tier dielectric cap layer 270 includes a dielectric material that may be the same as, or different from, the material of the first insulating layers 132. In one embodiment, the first-tier dielectric cap layer 270 can include silicon oxide. In one embodiment, the thickness of the first-tier dielectric cap layer 270 can be in a range from 20 nm to 100 nm, although lesser and greater thicknesses can also be employed. The first alternating stack (132, 142) and the first dielectric cap layer 270 collectively constitutes a first tier structure (132, 142, 270)

The first tier structure (132, 142, 270) can be patterned to form first stepped surfaces. The first stepped surfaces form a first terrace region, which is located within an area of the contact region 200. The contact region 200 includes a first stepped area in which the first stepped surfaces are formed, and a second stepped area in which additional stepped surfaces are to be subsequently formed in an second tier structure (to be subsequently formed over the first tier structure). The memory array region 100 is provided adjacent to the contact region 200. Memory devices including memory stack structures can be subsequently formed in the memory array region 100. The first stepped surfaces can be formed, for example, by forming a mask layer with an opening therein, etching a cavity within the levels of the topmost first sacrificial material layer 142 and the topmost first insulating layer 132, and iteratively expanding the etched area and vertically recessing the cavity by etching each pair of a first insulating layer 132 and a first sacrificial material layer 142 located directly underneath the bottom surface of the etched cavity within the etched area. The first-tier dielectric cap layer 270 and the first alternating stack (132, 142) are patterned such that each underlying first sacrificial material layer 142 laterally protrudes farther than any overlying first sacrificial material layer 142 in the etched region, and each underlying first insulating layer 132 laterally protrudes farther than any overlying first insulating layer 132 in the etched region. The contact region can be a contact region of the first alternating stack (132, 142). The cavity is herein referred to as a first stepped cavity.

A dielectric material is deposited to fill the first stepped cavity. Excess portions of the dielectric material overlying the topmost surface of the first alternating stack (132, 142), are removed for example, by chemical mechanical planarization. The remaining portion of the deposited dielectric material forms a first dielectric material portion, which is herein referred to as a first retro-stepped dielectric material portion 165. The first retro-stepped dielectric material portion 165 is formed on the first stepped surfaces. The first dielectric material portion 165 is retro-stepped. As used herein, a "retro-stepped" element refers to an element that has stepped surfaces and a horizontal cross-sectional area that increases monotonically as a function of a vertical distance from a top surface of a substrate on which the element is present. The first tier structure, which is also referred to as a first stack structure, comprises the first alternating stack (132, 142) and the first retro-stepped dielectric material portion 165. The first retro-stepped dielectric material portion 165 is incorporated into the first tier structure (132, 142, 270, 165).

Figure 3A:
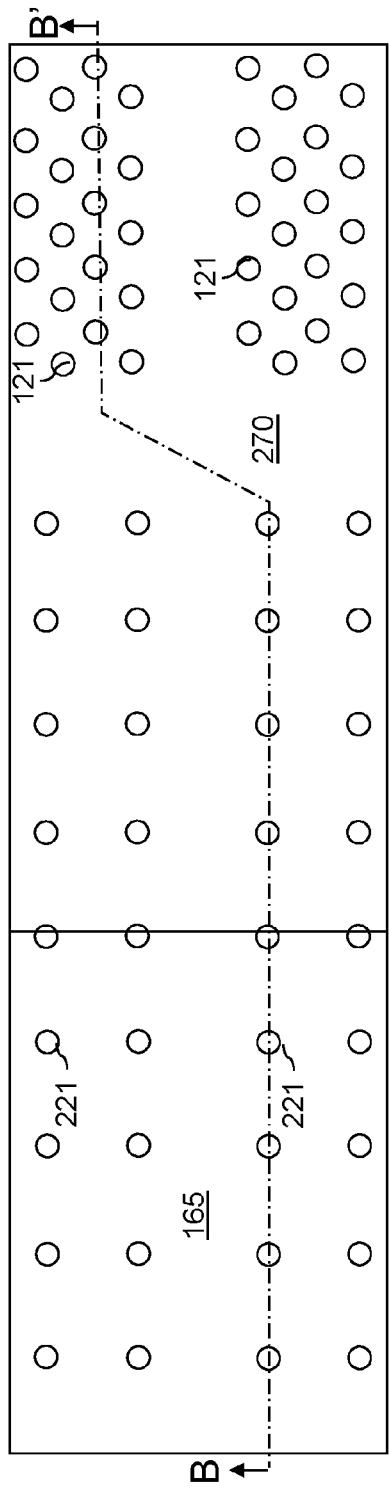
FIG. 3A is a top-down view of the first exemplary structure after formation of first memory openings in a memory array region and first support openings in a contact region according to an embodiment of the present disclosure.
Figure 3B:
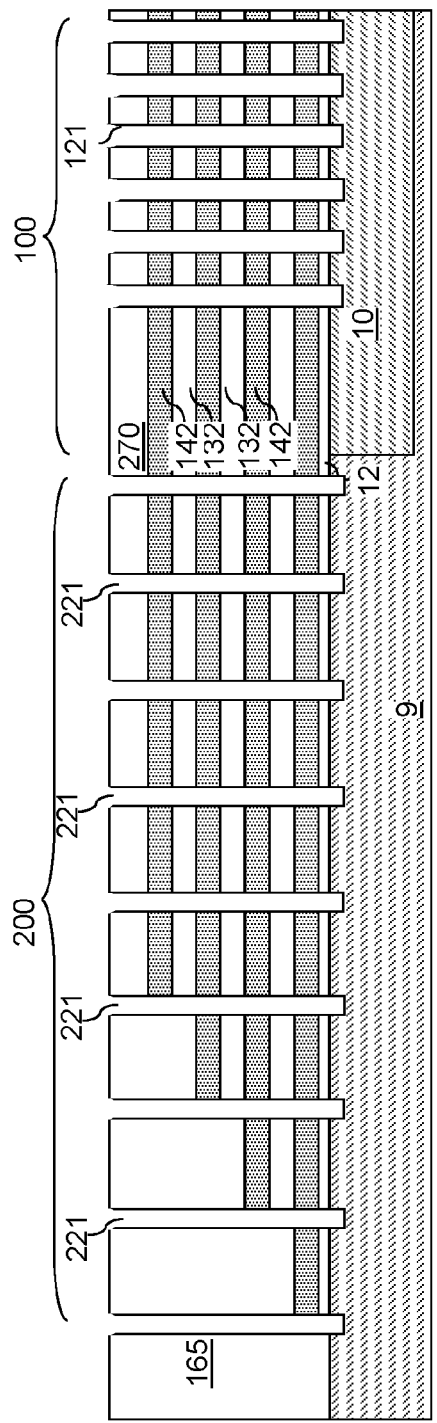
FIG. 3B is a vertical cross-sectional view of the first exemplary structure of FIG. 3A along the vertical plane B-B'.

Referring to FIGS. 3A and 3B, first openings (121, 221) extending to a top surface of the substrate (9, 10) are formed through the first tier structure (132, 142, 270, 165). The first openings (121, 221) include first memory openings 121 that are formed in the memory array region 100 and first support openings 221 that are formed in the contact region 200. The first memory openings 121 and the first support openings 221 can be formed concurrently by a patterning process. To form the first openings (121, 221), a lithographic material stack (not shown) including at least a photoresist layer can be formed over the first tier structure (132, 142, 270, 165), and can be lithographically patterned to form openings within the lithographic material stack. The pattern in the lithographic material stack can be transferred through the entirety of the first tier structure (132, 142, 270, 165) by at least one anisotropic etch that employs the patterned lithographic material stack as an etch mask. Portions of the first tier structure (132, 142, 270, 165) underlying the openings in the patterned lithographic material stack are etched to form the first openings (121, 221). In other words, transfer of the pattern in the patterned lithographic material stack through the first tier structure (132, 142, 270, 165) forms the first openings (121, 221).

In one embodiment, the chemistry of the anisotropic etch process employed to etch through the materials of the first alternating stack (132, 142) can alternate to optimize etching of the first and second materials in the first alternating stack (132, 142) while providing a comparable average etch rate for the first dielectric material portion 165. The anisotropic etch can be, for example, a series of reactive ion etches. The sidewalls of the first openings (121, 221) can be substantially vertical, or can be tapered. Subsequently, the patterned lithographic material stack can be subsequently removed, for example, by ashing. The first memory openings 121 and the first support openings 221 can be formed concurrently employing the same set of anisotropic etch processes.

In one embodiment, the substrate (9, 10) can be employed as a stopping layer for the anisotropic etch process. In one embodiment, the first openings (121, 221) may extend below the top surface of the substrate (9, 10) by an overetch. The lateral dimensions (e.g., a diameter) of the first openings (121, 221) can be from about 20 nm to 200 nm at an upper portion of each first opening (121, 221), and can be about 10 nm to 150 nm at a lower portion of each first opening (121, 221).

In one embodiment, the first memory openings 121 can be formed as an array of openings, which can be a periodic two-dimensional array of openings. The first support openings 221 can be formed as discrete openings that are mutually separated from one another, and may, or may not, form a periodic two-dimensional array pattern. In one embodiment, the first support openings 221 may form a plurality of periodic one-dimensional array patterns that are parallel among one another.

Referring to FIGS. 4A and 4B, a dielectric liner (not shown) can be optionally formed within the first memory openings 121 and the first support openings 221. For example, a thermal oxidation process, a thermal nitridation process, a plasma oxidation process, and/or a plasma nitridation process can be performed to convert surface portions of the semiconductor material layer 10 and/or the substrate semiconductor layer 9 at the bottom of each first memory opening 121 and each first support opening 221 to form the dielectric liner. Alternatively, a thin dielectric material layer can be conformally deposited to provide the dielectric liner. The thickness of the dielectric liner can be in a range from 1 nm to 3 nm, although lesser and greater thicknesses can also be employed.

A first fill material can be deposited in the first support openings 221 and in the first memory openings 121 simultaneously. The first fill material can be an insulating material or a semiconducting material. The first fill material has a composition different from the material of the first insulating layers 132, and can have electrical resistivity greater than 10 $\Omega$-cm. In one embodiment, the electrical resistivity of the first fill material can be greater than 100 $\Omega$-cm. In one embodiment, the electrical resistivity of the first fill material can be greater than 1,000 $\Omega$-cm, such as 10,000 to $10^{20}$ $\Omega$-cm, including $10^5$ to $10^{17}$ $\Omega$-cm. Non-limiting examples of the first fill material includes amorphous silicon, polycrystalline silicon, an amorphous silicon-germanium alloy, and a polycrystalline silicon-germanium alloy. In case a semiconductor material is employed, the semiconductor material (such as amorphous silicon) is undoped (i.e., intrinsic). Excess portions of the deposited first fill material can be removed from above the horizontal plane including the topmost surface of the first tier structure (132, 142, 270, 165). Remaining portions of the deposited first fill material in the first openings (121, 221) are herein referred to as first fill material portions (122, 222).

The first fill material portions (122, 222) include first memory opening fill portions 122 that fill the first memory openings 121 and first support opening fill portions 222 that fill the first support openings 221. A subset of the first support opening fill portions 222 extends through the first retro-stepped dielectric material portion 165 and the first stepped surfaces on the first alternating stack (132, 142). Each instance of the first support opening fill portions 222 can include a material having electrical resistivity greater than 10 $\Omega$-cm and having a composition different from the material of the first insulating layers 132 and from the material of the first sacrificial material layers 142.

Figure 5A:
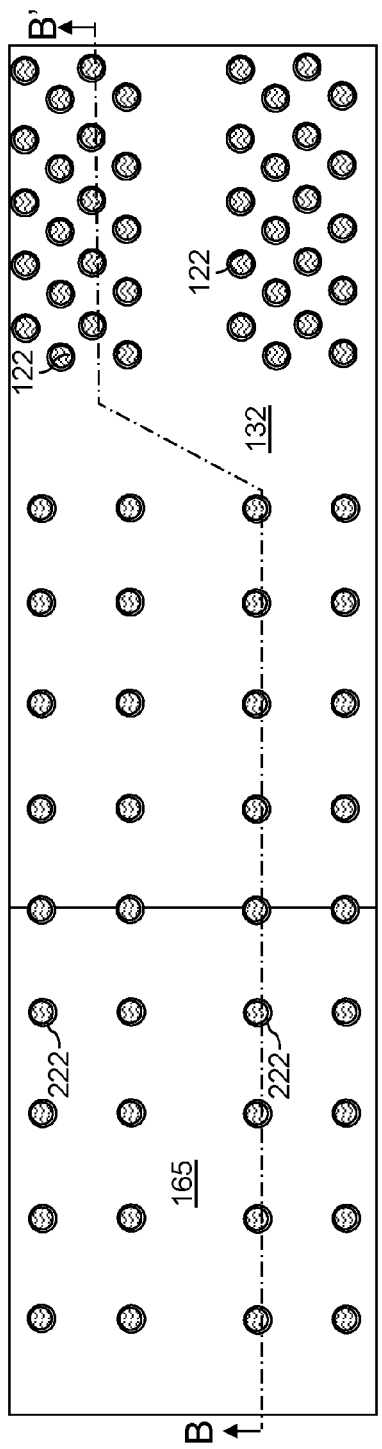
FIG. 5A is a top-down view of the first exemplary structure after vertically recessing the first fill material portions and lateral expansion of top regions of the first support openings and the first memory openings according to an embodiment of the present disclosure.
Figure 5B:
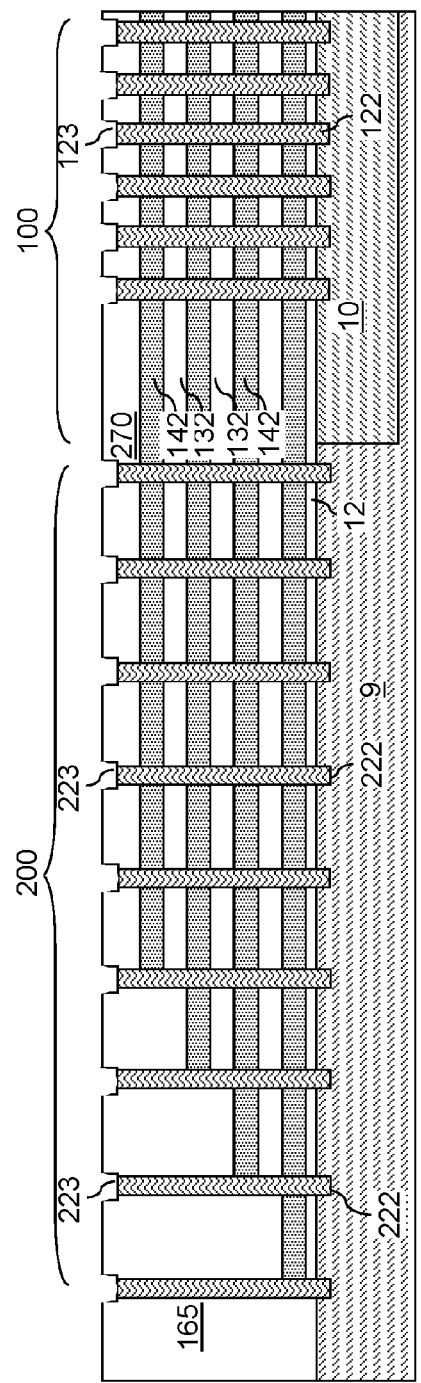
FIG. 5B is a vertical cross-sectional view of the first exemplary structure of FIG. 5A along the vertical plane B-B'.

Referring to FIGS. 5A and 5B, top regions of the first fill material portions (122, 222) can be optionally removed, for example, by a recess etch that removes the first fill material of the first fill material portions (122, 222) selective to the material of the first-tier dielectric cap layer 270. The recess etch can be an isotropic etch such as a wet etch or an anisotropic etch such as a reactive ion etch. For example, if the first fill material portions (122, 222) include undoped polysilicon material, a wet etch employing KOH can be employed to recess the undoped semiconductor material of the first fill material portions (122, 222) selective to the material of the first-tier dielectric cap layer 270. The duration of the recess etch can be selected such that the recessed top surfaces of the first fill material portions (122, 222) are formed between a first horizontal plane including the top surface of the first-tier dielectric cap layer 270 and a second horizontal plane including the bottom surface of the first-tier dielectric cap layer 270.

Subsequently, an isotropic etch can be performed to recess the dielectric material of the first-tier dielectric cap layer 270 selective to the fill material of the first fill material portions (122, 222). The volume of each cavity (123, 223) overlying the first fill material portions (122, 222) as recessed can be laterally expanded to increase the horizontal cross-sectional area of each cavity overlying a respective first fill material portion (122, 222).

Referring to FIGS. 6A and 6B, a second fill material can be deposited in the respective cavities (123, 223) overlying the first fill material portions (122, 222) as recessed at a processing step of FIGS. 5A and 5B. The second fill material can be any of the material that can be employed as the first fill material. The second fill material may be the same as, or may be different from, the first fill material. For example, the second fill material can include an undoped semiconductor material (e.g., polysilicon or undoped amorphous silicon). Excess portions of the second fill material deposited over the horizontal plane including the top surface of the first-tier dielectric cap layer 270 can be removed by a planarization process, which can include chemical mechanical planarization, a recess etch, or a combination thereof.

Each remaining portion of the second fill material that fills a respective cavity (123, 223) is herein referred to as a second fill material portion (124, 224). The second fill material portions (124, 224) includes second memory opening fill portions 124 and second support opening fill portions 224. Each second memory opening fill portion 124 is formed directly on a respective first memory opening fill portion 122. Each second support opening fill portion 224 is formed directly on a respective first support opening fill portion 222. A vertical stack of a first memory opening fill portion 122 and a second memory opening fill portion 124 constitutes a sacrificial pillar structure 127, which is subsequently removed. A vertical stack of a first support opening fill portion 222 and a second support opening fill portion 224 constitutes a first support pillar structure 227.

The processing steps of FIGS. 5A, 5B, 6A, and 6B are optional. In case the processing steps of FIGS. 5A, 5B, 6A, and 6B, each sacrificial pillar structure 127 can consist of a first memory opening fill portion 122 that vertically extend up to the horizontal plane including the top surface of the first-tier dielectric cap layer 270, and each first support pillar structure 227 can consist of a first support opening fill portion 222.

Generally, at least one fill material can be deposited within the first support openings 221, with or without lateral expansion of the top portions thereof, to form first support pillar structures 227. Each sacrificial pillar structure 127 is formed by depositing the at least one fill material within the first memory openings 121 concurrently with deposition of the at least one fill material within the first support openings 221. Portions of the deposited at least one fill material in the first memory openings 121, with or without expansion of the top portions thereof, constitute the sacrificial pillar structures 127.

Referring to FIGS. 7A and 7B, a second alternating stack (232, 242) of material layers is subsequently formed on the top surface of the first tier structure (132, 142, 270, 165). The second alternating stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers and the fourth material layers can be second insulating layers 232 and second sacrificial material layers 242, respectively. The third material of the second insulating layers 232 can be at least one insulating material. The fourth material of the second sacrificial material layers 242 is a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second alternating stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material. For example, the first and second sacrificial material layers (142, 242) can include silicon nitride, and the first and second insulating layers (132, 232) can include silicon oxide.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second alternating stack (232, 242) can have a uniform thickness that is substantially invariant within each respective second sacrificial material layer 242.

A second-tier dielectric cap layer 70 can be subsequently formed over the second alternating stack (232, 242). The second-tier dielectric cap layer 70 includes a dielectric material that is different from the material of the second sacrificial material layers 242. The second-tier dielectric cap layer 70 includes a dielectric material that may be the same as, or different from, the material of the second insulating layers 232. In one embodiment, the second-tier dielectric cap layer 70 can include silicon oxide.

The second alternating stack (232, 242) and the second-tier dielectric cap layer 70 constitute a second tier structure (232, 242, 70). The first support pillar structures 227 extend through the first tier structure (132, 142, 270, 165), and have respective topmost surfaces at an interface between the first tier structure (132, 142, 270, 165) and the second tier structure (232, 242, 70). The topmost surfaces of the first support pillar structure 227 are formed within the same horizontal plane as the interface between the first tier structure (132, 142, 270, 165) and the second tier structure (232, 242, 70).

Referring to FIGS. 8A and 8B, additional stepped surfaces are formed in the second alternating stack (232, 242) in the contact region 200. The additional stepped surfaces are herein referred to as second stepped surfaces. The second stepped surfaces are formed in a second stepped area, which is adjacent to, and does not overlie, the first stepped area of the first stepped surfaces within the first tier structure (132, 142, 270, 165). The second stepped surfaces can be adjacent to, and do not overlie, the stepped interface between the first alternating stack (132, 142) and the first retro-stepped dielectric material portion 165. The second stepped surfaces overlie a subset of the first support pillar structures 227 that do not extend through the first retro-stepped first dielectric material portion 165 within the first tier structure (132, 142, 270, 165).

The second stepped surfaces can be formed, for example, by forming a mask layer with an opening therein, etching a cavity within the levels of the topmost second sacrificial material layer 242 and the topmost second insulating layer 232, and iteratively expanding the etched area and vertically recessing the cavity by etching a pair of a second insulating layer 232 and a second sacrificial material layer 242 located directly underneath the bottom surface of the etched cavity within the etched area. The second alternating stack (232, 242) is patterned such that each underlying second sacrificial material layer 242 laterally protrudes farther than any overlying second sacrificial material layer 242 in the etched region, and each underlying second insulating layer 232 laterally protrudes farther than any overlying second insulating layer 232 in the etched region. The etched area includes the area of the contact region 200, which includes the contact area for the second alternating stack (232, 242) and a contact area for the first alternating stack (132, 142).

Thus, the second alternating stack (232, 242) is patterned to form the second stepped surfaces thereupon. The cavity formed by removal of portions of the second alternating stack (232, 242) is herein referred to as a second stepped cavity. The area of the second stepped cavity includes the area of the first retro-stepped first dielectric material portion 165, from which all layers of the second alternating stack (232, 242) are removed. The area of the second stepped cavity further includes the area of the second stepped surfaces of the second alternating stack (232, 242).

Dielectric material is deposited to fill the second stepped cavity. Excess portions of the dielectric material overlying the topmost surface of the second alternating stack (232, 242) are removed, for example, by chemical mechanical planarization. The remaining portion of the deposited dielectric material is retro-stepped, and thus, forms a second dielectric material portion, which is herein referred to as a second retro-stepped dielectric material portion 265. The second retro-stepped dielectric material portion 265 is located on, and over, the second stepped surfaces of the second alternating stack (232, 242). The second retro-stepped dielectric material portion 265 is formed on the second stepped surfaces. The contact region 200 comprises a region of the first stepped surfaces and a region of the second stepped surfaces. Upon formation of the second retro-stepped dielectric material portion 265, the second retro-stepped dielectric material portion 265 is incorporated into the second tier structure (232, 242, 70, 265), i.e., becomes an element of the second tier structure (232, 242, 70, 265).

The first stepped surfaces and the second stepped surfaces are collectively referred to as "stepped surfaces." A first portion of the stepped surfaces is the first stepped surfaces located in the first tier structure (132, 142, 270, 165). As second portion of the stepped surfaces is the second stepped surfaces located in the second tier structure (232, 242, 70, 265). The first stepped surfaces and the second stepped surfaces are located within the contact region 200.

The region of the stepped surfaces is herein referred to as a terrace region. Each sacrificial material layer (142, 242) among the first and second sacrificial material layers (142, 242) that is not a bottommost first sacrificial material layer 142 laterally extends less than any underlying layer among the first and second sacrificial material layers (142, 242). The terrace region includes stepped surfaces of the first and second alternating stacks (132, 142, 232, 242) that continuously extend from a bottommost layer within the first alternating stack (132, 142) to a topmost layer within the second alternating stack (232, 242).

Referring to FIGS. 9A and 9B, second openings (141, 241) are formed through the second tier structure (232, 242, 265, 70) to the top surface of the first tier structure (132, 142, 270, 165). The second openings (141, 241) include second memory openings 141 that are formed in the memory array region 100 and second support openings 241 that are formed in the contact region 200.

The second memory openings 141 are formed through the second tier structure (232, 242, 70, 265) in areas that overlap with the first memory openings 121, i.e., with the sacrificial pillar structures 127. Thus, each second memory opening 141 can be formed on top of a respective sacrificial pillar structure 127 (which are present in the first memory openings 121). In one embodiment, the bottom surface of each second memory opening 141 can be formed within a periphery of a top surface of an underlying sacrificial pillar structure 127, i.e., can have an areal overlap with the top surface of the underlying sacrificial pillar structure 127.

The second support openings 241 are formed through the second tier structure (232, 242, 70, 265) such that each second support opening 241 is formed in areas that do not overlap with the areas of the first support pillar structure 227. In other words, locations of the second support openings 241 are selected such that the areas of the second support openings 241 do not have any overlap with the areas of the first support pillar structures 227 located in the first support openings 221 in a plan view (such as FIG. 9A). Each bottom surface of the second memory openings 141 may be entirely within the area of a top surface of an underlying sacrificial pillar structure 127. Thus, the entirety of the first support pillar structures 227 is covered by the second tier structure (232, 242, 70, 265), and each of the second support openings 241 is laterally offset, i.e., laterally spaced, from the first support pillar structures 227.

The second openings (141, 241) can be formed by a combination of lithographic patterning and an anisotropic etch. For example, a lithographic material stack (not shown) including at least a photoresist layer can be formed over the second tier structure (232, 242, 265, 70), and can be lithographically patterned to form openings within the lithographic material stack. The pattern in the lithographic material stack can be transferred through the entirety of the second tier structure (232, 242, 265, 70) by at least one anisotropic etch that employs the patterned lithographic material stack as an etch mask. Portions of the second tier structure (232, 242, 265, 70) underlying the openings in the patterned lithographic material stack are etched to form the second openings (141, 241). In other words, transfer of the pattern in the patterned lithographic material stack through the second tier structure (232, 242, 265, 70) forms the second openings (141, 241).

In one embodiment, the chemistry of the anisotropic etch process employed to etch through the materials of the second alternating stack (232, 242) can alternate to optimize etching of the third and fourth materials in the second alternating stack (232, 242) while providing a comparable average etch rate for the second dielectric material portion 265. The anisotropic etch can be, for example, a series of reactive ion etches. The sidewalls of the second openings (141, 241) can be substantially vertical, or can be tapered.

The second memory openings 141 are formed through the second tier structure (232, 242, 265, 70) in areas overlying the first memory openings 121, which are filled with the sacrificial pillar structures 127. Thus, the second memory openings 141 are formed on sacrificial pillar structures 127 (which are formed in the first memory openings 121). The second support openings 241 are formed through the second tier structure (232, 242, 265, 70) without any areal overlap with the first support pillar structures 227. Thus, the bottom surface of each second support openings 241 can be a horizontal surface of the first tier dielectric cap layer 270, a horizontal surface of the first retro-stepped dielectric material portion 165, or a combination of horizontal surface of the first tier dielectric cap layer 270 and a horizontal surface of the first retro-stepped dielectric material portion 165 in case the second support opening 241 straddles the interface between the first tier dielectric cap layer 270 and the first retro-stepped dielectric material portion 165.

A subset of the second support openings 241 can be formed through the second portion of the stepped surfaces (i.e., the second stepped surfaces) located on the second alternating stack (232, 242). The second support opening 241 and the second memory openings 141 can be simultaneously formed employing at least one anisotropic etch process.

The lateral dimensions (e.g., a diameter) of the second openings (141, 241) can be comparable to the lateral dimensions of the first openings (121, 221). For example, the lateral dimensions of the second openings (141, 241) can be from about 20 nm to 200 nm at an upper portion of each second opening (141, 241), and can be about 10 nm to 150 nm at a lower portion of each second opening (141, 241). In one embodiment, the second memory openings 141 and the first memory openings 121 can be formed as an array of openings, which can be a periodic two-dimensional array of openings. The second support openings 241 and the first support openings 221 can be formed as discrete openings that are mutually separated from one another, and may, or may not, form a periodic two-dimensional array pattern. Subsequently, the patterned lithographic material stack can be subsequently removed, for example, by ashing.

Referring to FIGS. 10A and 10B, the fill materials of sacrificial pillar structures 127 can be removed from underneath the second memory openings 141 without removing the first support pillar structures 227. An isotropic etch or an anisotropic etch may be performed to remove the materials of the sacrificial pillar structures 127 selective to the materials of the insulating layers (132, 232), the sacrificial material layers (142, 242), the second tier dielectric cap layer 70, and the first tier dielectric cap layer 270. In case a dielectric liner is formed at the processing steps of FIGS. 4A and 4B, the dielectric liner can function as an etch stop layer. In case the sacrificial pillar structures 127 include a semiconductor material such as silicon or a silicon-germanium alloy, a wet etch process employing a KOH solution can be employed to remove the materials of the sacrificial pillar structures 127. Any dielectric liner, if present, can be subsequently removed by an etch process, which can be a wet etch employing hydrofluoric acid or phosphoric acid.

Removal of the sacrificial pillar structures 127 from underneath the second memory openings 141 forms inter-tier memory openings 49, each of which extends through the first and second tier structures (132, 142, 270, 165, 232, 242, 265, 70). Each inter-tier memory opening 49 includes a volume of a first memory opening 121 and a second memory opening 141. Each inter-tier memory openings 49 extends through the entirety of the first alternating stack (132, 142) and the second alternating stack (232, 242).

FIG. 11A shows a vertical cross-sectional view of an inter-tier memory opening 49 after the processing steps of FIGS. 10A and 10B. FIG. 11B shows a vertical cross-sectional view of a second support opening 241 and a first support pillar structures 227 that fills a first support opening. As discussed above, the second support opening 241 does not have any areal overlap with the first support pillar structure 227.

Referring to FIGS. 12A and 12B, epitaxial channel portions 11 may be optionally formed by a selective epitaxy process at the bottom of the inter-tier memory openings 49 by a selective epitaxy process. During a selective epitaxy process, a semiconductor material grows only from semiconductor surfaces and does not grow from dielectric surfaces. Thus, the epitaxial channel portions 11 are formed only at the bottom of the inter-tier memory openings 49, and are not formed within the second support openings 241. The epitaxial channel portions 11 comprise a single crystalline semiconductor material in epitaxial alignment with the single crystalline substrate semiconductor material of the semiconductor material layer 10 (or the substrate semiconductor layer 9). Optionally, the epitaxial channel portions 11 can be doped with electrical dopants of a suitable conductivity type. In one embodiment, the semiconductor material layer 10 and the epitaxial channel portions 11 can have a doping of the first conductivity type (e.g., p-type).

Referring to FIGS. 13A and 13B, a stack of material layers for forming a memory film and a first semiconductor channel layer 601 can be deposited within each of the inter-tier memory openings 49 and the second support openings 241. For example, the stack of material layers can include an optional blocking dielectric layer 52, a charge storage layer 54, a tunneling dielectric layer 56, and an optional first semiconductor channel layer 601.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers (142, 242) and the insulating layers 32 can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232) and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601). A support cavity 241' can be formed within each volume of the second support opening 241 that is not filled with the deposited material layers (52, 54, 56, 601).

Referring to FIGS. 14A and 14B, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second tier dielectric cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' and each support cavity 241' can be removed to form openings in remaining portions thereof. Each of the first semiconductor channel layer 601, the tunneling dielectric layer 56, the charge storage layer 54, and the blocking dielectric layer 52 can be etched by anisotropic etch process.

The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

Within each inter-tier memory opening 49, a surface of the epitaxial channel portion 11 (or a surface of the semiconductor substrate layer 10 in case the epitaxial channel portions 11 are not employed) can be physically exposed underneath the opening through the first semiconductor channel layer 601, the tunneling dielectric layer 56, the charge storage layer 54, and the blocking dielectric layer 52. Within each second support opening 241, a surface of the first tier dielectric cap layer 270 can be physically exposed through an opening that extends through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the charge storage layer 54.

A set of a blocking dielectric layer 52, a charge storage layer 54, and a tunneling dielectric layer 56 in each of the inter-tier memory openings 49 and the second support openings 241 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIGS. 15A and 15B, a second semiconductor channel layer 602 can be deposited directly on the semiconductor surface of the epitaxial channel portion 11 (or on the semiconductor substrate layer 10 if the epitaxial channel portion 11 is omitted), and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each inter-tier memory opening 49, or may fully fill the memory cavity 49' in each inter-tier memory opening 49.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

In case the memory cavity 49' in each inter-tier memory opening 49 and/or the support cavity 241' in each second support opening 241 are not completely filled by the second semiconductor channel layer 602, a dielectric core layer 62L can be deposited in the memory cavities 49' and/or the support cavities 241'. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIGS. 16A and 16B, the horizontal portion of the dielectric core layer 62L can be removed, for example, by a recess etch from above the top surface of the second tier dielectric cap layer 70. Each remaining portion of the dielectric core layer constitutes a dielectric core 62. Further, the horizontal portion of the second semiconductor channel layer 602 located above the top surface of the second tier dielectric cap layer 70 can be removed by a planarization process, which can employ a recess etch or chemical mechanical planarization (CMP).

Each adjoining pair of a first semiconductor channel layer 601 and a second semiconductor channel layer 602 can collectively form a vertical semiconductor channel 60. The vertical semiconductor channel 60 with each inter-tier memory opening 49 is subsequently electrically connected to a respective contact via structure. Within each inter-tier memory opening 49, electrical current can flow through a vertical semiconductor channel 60 when a vertical NAND device including the vertical semiconductor channel 60 is turned on. Within each second support opening 241, a vertical semiconductor channel 60 is formed as a dummy structure, i.e., an electrically inactive structure. The vertical semiconductor channel 60 is not subsequently contacted by any contact via structure.

Within each inter-tier memory opening 49 and each second support opening 241, a tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50. Each memory film 50 within an inter-tier memory opening 49 can store electrical charges with a macroscopic retention time. Each memory film 50 within a second support opening is an inactive component that functions merely as an insulating film. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

The top surface of each dielectric core 62 can be further recessed within each inter-tier memory opening 49 and within each second support opening 241, for example, by a recess etch to a depth that is located between the top surface of the second tier dielectric cap layer 70 and the bottom surface of the second tier dielectric cap layer 70. A doped semiconductor material can be deposited within each recessed region above the dielectric cores 62. The doped semiconductor material can be, for example, doped polysilicon. Excess portions of the deposited semiconductor material can be removed from above the top surface of the second tier dielectric cap layer 70, for example, by chemical mechanical planarization (CMP) or a recess etch. Within the inter-tier memory openings 49, each remaining portion of the doped semiconductor material overlying a respective dielectric core 62 constitutes a drain region 63. Within the second support openings 241, each remaining portion of the doped semiconductor material overlying a respective dielectric core constitutes a dummy drain region 163.

Each drain region 63 within an inter-tier memory opening 49 is electrically connected to a subsequently formed bit line and comprises a top active region of a vertical field effect transistor including a respective vertical semiconductor channel 60. Each dummy drain region 163 within a second support opening 241 is electrically inactive. Each dummy drain region 163 in the second support opening 241 is not subsequently contacted by any contact via structure (i.e., is not electrically connected to a subsequently formed bit line). The drain regions 63 and the dummy drain regions 163 can have the same material composition. In one embodiment, the drain regions 63 and the dummy drain regions 163 can be heavily doped. In one embodiment, the drain regions 63 and the dummy drain regions 163 can include electrical dopants (p-type dopants or n-type dopants) at an atomic concentration greater than $5.0 \times 10^{19}/cm^3$.

Each contiguous set of a memory film 50, a vertical semiconductor channel 60, and an optional dielectric core 62 formed within an inter-tier memory opening 49 constitutes a memory stack structure 55. Each contiguous set of a memory film 50, a vertical semiconductor channel 60, an optional dielectric core 62, and a dummy drain region 163 formed within a second support opening 241 constitutes a second support pillar structure 155.

FIGS. 17A and 17B illustrate the first exemplary structure after formation of the memory stack structures 55, the drain regions 63, and the second support pillar structures 155. Thus, memory stack structures 55 extending through the first tier structure (132, 142, 270, 165) and the second tier structure (232, 242, 70, 265) are formed. Each of the memory stack structures 55 includes a memory film 50 and a vertical semiconductor channel 60. Second support pillar structures 155 are formed in the second support openings 241. The second support pillar structures 155 and the memory stack structures 55 are formed employing a same set of processing steps. In one embodiment, the second support pillar structures 155 are not in physical contact with any of the first support pillar structures 227. In another embodiment, the second support pillar structures 155 do not overlap with any of the first support pillar structures 227. Preferably, the second support pillar structures 155 are not in physical contact with any of the first support pillar structures 227 and do not overlap with any of the first support pillar structures 227.

Each of the memory stack structures 55 comprises a memory film 50 including a first layer stack (52, 53, 56), and each of the second support pillar structures 155 comprise a second layer stack (52, 54, 56). Each layer within the second layer stack (52, 54, 56) has a same thickness and a same material composition as a corresponding layer within the first layer stack (52, 54, 56). In one embodiment, the first layer stack (52, 54, 56) comprises a charge storage layer 54 and a tunneling dielectric layer 56. A bottommost surface of each second layer stack (52, 54, 56) within the second support openings 241 is formed directly on a top surface of a topmost layer (such as the first tier dielectric cap layer 270) of the first tier structure (132, 142, 270, 165). Each memory film 50 in the first layer stack (52, 54, 56) extends through the entirety of second sacrificial material layers 242 and a predominant subset (i.e., more than 50%) of the first sacrificial material layers 142.

Each of the memory stack structures 55 comprises a vertical semiconductor channel 60 including a semiconductor material, and each of the second support pillar structures 155 comprise a semiconductor material layer (i.e., a vertical semiconductor channel 60 that is electrically inactive) having a same composition as the vertical semiconductor channel 60 within a memory stack structure 55. A bottommost surface of each semiconductor material layer 60 of the second support pillar structures 155 is formed directly on a top surface of a topmost layer (such as the first tier dielectric cap layer 270) of the first tier structure (132, 142, 270, 165). Each vertical semiconductor channel 60 of the memory stack structures 55 extends through the entirety of second sacrificial material layers 242 and a predominant subset of the first sacrificial material layers 142.

Figure 18A:
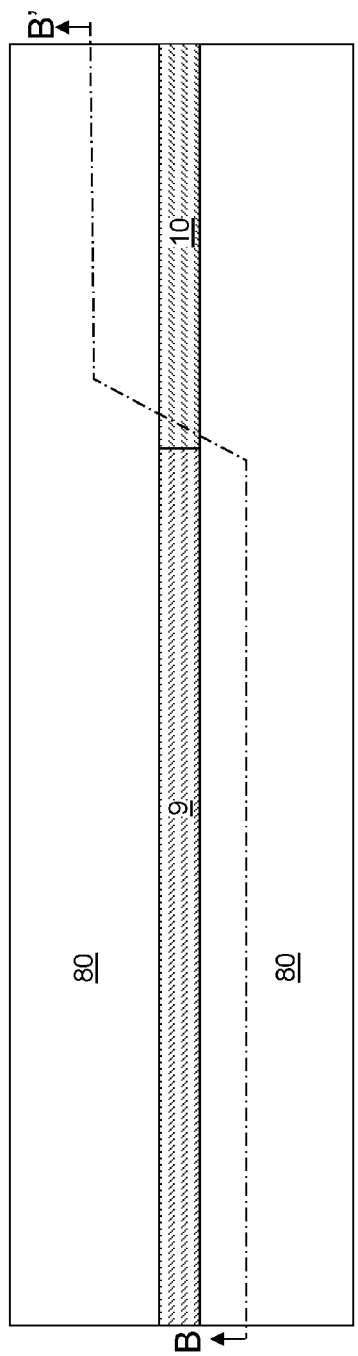
FIG. 18A is a top-down view of the first exemplary structure after formation of a contact level dielectric layer and a backside contact trench according to an embodiment of the present disclosure.
Figure 18B:
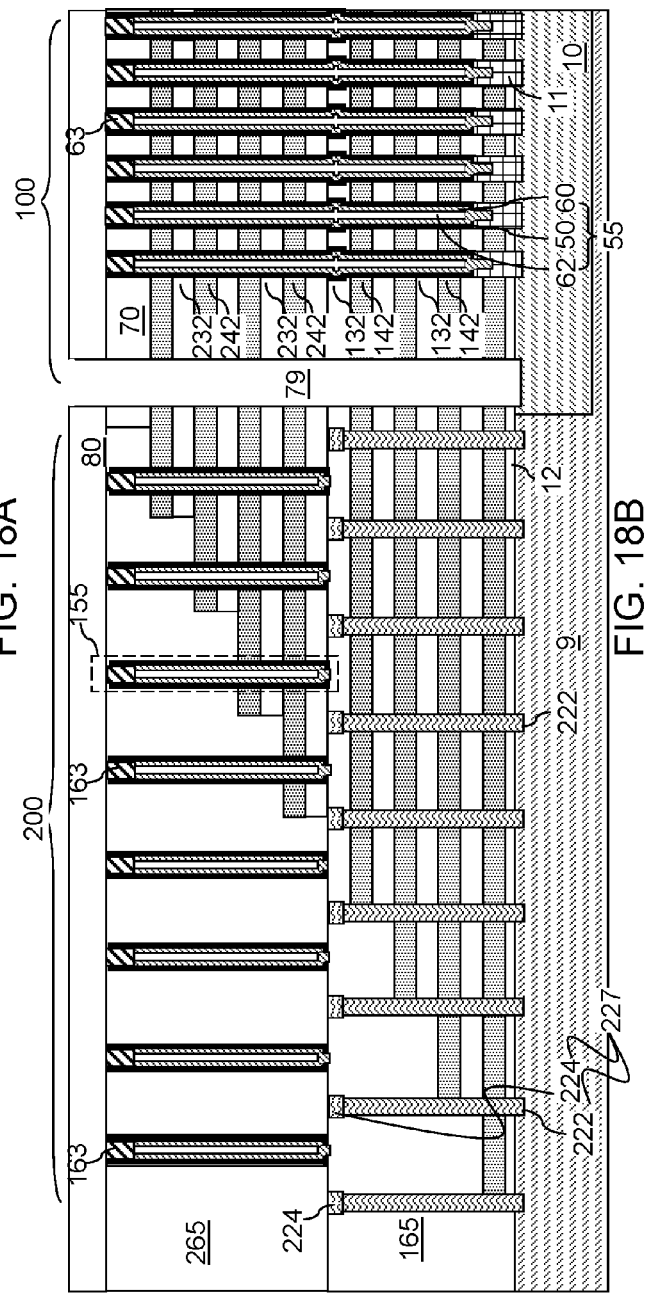
FIG. 18B is a vertical cross-sectional view of the first exemplary structure of FIG. 18A along the vertical plane B-B'.

Referring to FIGS. 18A and 18B, a contact level dielectric layer 80 can be formed over the second tier structure (232, 242, 265, 70). The contact level dielectric layer 80 includes a dielectric material such as silicon oxide, a dielectric metal oxide, and/or organosilicate glass. In one embodiment, the contact level dielectric layer 80 can be composed primarily of a silicon oxide material. The thickness of the contact level dielectric layer 80 can be in a range from 50 nm to 500 nm, although lesser and greater thicknesses can also be employed.

A photoresist layer (not shown) can be applied over the contact level dielectric layer 80, and is lithographically patterned to form at least one elongated opening in each area in which formation of a backside contact via structure is desired. The pattern in the photoresist layer can be transferred through the contact level dielectric layer 80, the second tier structure (232, 242, 265, 70), and the first tier structure (132, 142, 270, 165) employing an anisotropic etch to form the at least one backside trench 79, which extends at least to the top surface of the substrate (9, 10). In one embodiment, the at least one backside trench 79 can include a source contact opening in which a source contact via structure can be subsequently formed.

Figure 19A:
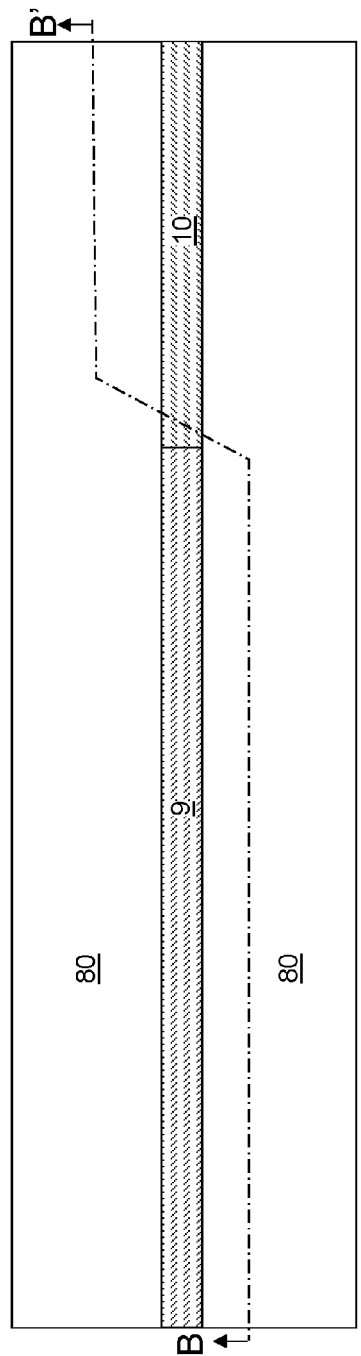
FIG. 19A is a top-down view of the first exemplary structure after formation of backside recesses according to an embodiment of the present disclosure.
Figure 19B:
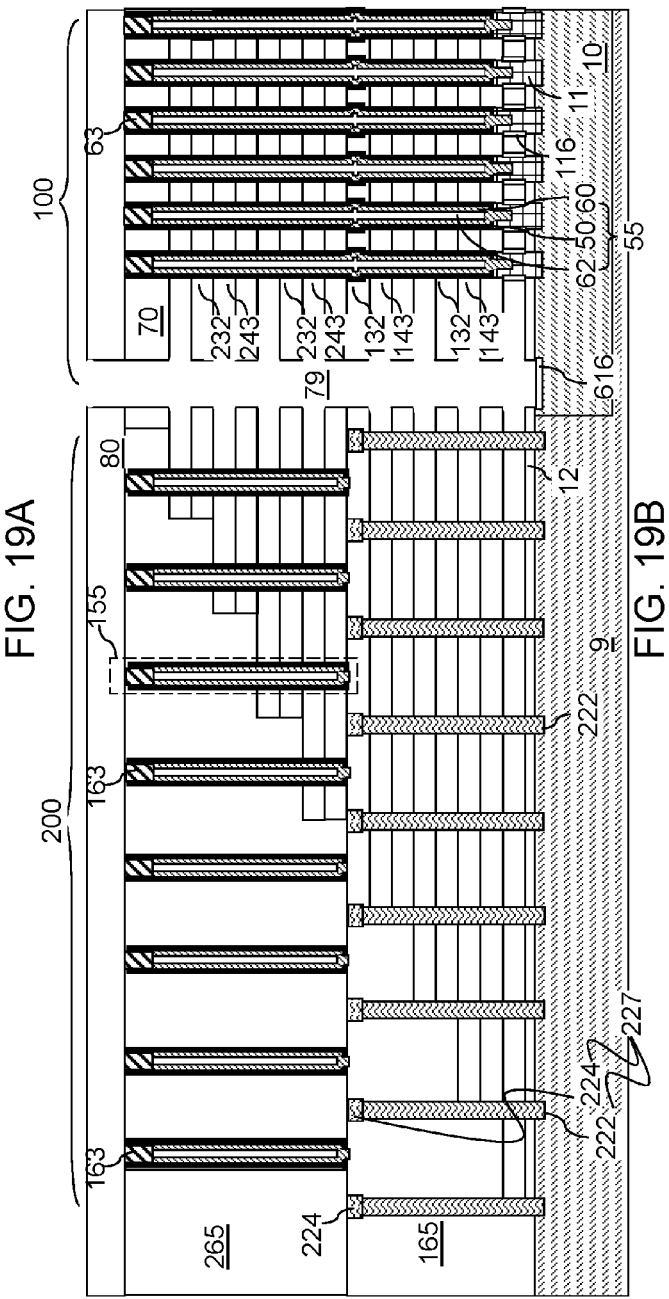
FIG. 19B is a vertical cross-sectional view of the first exemplary structure of FIG. 19A along the vertical plane B-B'.

Referring to FIGS. 19A and 19B, an etchant that selectively etches the second material of the sacrificial material layers (142, 242) with respect to the materials of the insulating layers (132, 232) and the semiconductor material(s) of the substrate (9, 10) can be introduced into the at least one backside trench 79, for example, employing an etch process. Backside recesses (143, 243) are formed in volumes from which the sacrificial material layers (142, 242) are removed. Specifically, first backside recesses 143 are formed in the volumes from which the first sacrificial material layers 142 are removed, and second backside recesses 243 are formed in the volumes from which the second sacrificial material layers 242 are removed.

The removal of the second material of the sacrificial material layers (142, 242) can be selective to the materials of the insulating layers (132, 232), the materials of the retro-stepped dielectric material portions (165, 265), the semiconductor material(s) of the substrate (9, 10), and the material of the outermost layer of the memory films 50. Each backside recess (143, 243) can be a laterally extending cavity having a lateral dimension that is greater than the vertical extent of the cavity. In other words, the lateral dimension of each backside recess (143, 243) can be greater than the height of the backside recess (143, 243). The inter-tier memory openings 49, the first support openings 221, and the second support openings 241 are herein referred to as front side openings or front side cavities in contrast with the backside recesses (143, 243). In one embodiment, the memory array region 100 comprises an array of monolithic three-dimensional NAND strings having a plurality of device levels disposed above the substrate (9, 10). In this case, each backside recess (143, 243) can define a space for receiving a respective word line of the array of monolithic three-dimensional NAND strings.

Each of the plurality of backside recesses (143, 243) can extend substantially parallel to the top surface of the substrate (9, 10). A backside recess (143, 243) can be vertically bounded by a top surface of an underlying insulating layer 32 and a bottom surface of an overlying insulating layer 32. In one embodiment, each backside recess (143, 243) can have a uniform height throughout.

Subsequently, physically exposed surface portions of the optional epitaxial channel portions 11 and the semiconductor material layer 10 may be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616.

Referring to FIGS. 20A and 20B, a backside blocking dielectric layer (not shown) can be optionally formed. The backside blocking dielectric layer, if present, comprises a dielectric material that functions as a control gate dielectric for the control gates to be subsequently formed in the backside recesses (143, 243). In case the blocking dielectric layer 52 is present within each memory opening, the backside blocking dielectric layer is optional. In case the blocking dielectric layer 52 is omitted, the backside blocking dielectric layer is present The backside blocking dielectric layer can be formed in the backside recesses (143, 243) and on a sidewall of the backside trench 79. The backside blocking dielectric layer can be formed directly on horizontal surfaces of the insulating layers (132, 232) and physically exposed sidewalls of the blocking dielectric 52 within the backside recesses (143, 243). If the backside blocking dielectric layer is formed, formation of the tubular dielectric spacers and the planar dielectric portion prior to formation of the backside blocking dielectric layer is optional. In one embodiment, the backside blocking dielectric layer can be formed by a conformal deposition process such as atomic layer deposition (ALD). The backside blocking dielectric layer can consist essentially of aluminum oxide. The thickness of the backside blocking dielectric layer can be in a range from 1 nm to 15 nm, such as 2 to 6 nm, although lesser and greater thicknesses can also be employed.

The dielectric material of the backside blocking dielectric layer can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. A backside cavity is present within the portion of each backside trench 79 that is not filled with the backside blocking dielectric layer.

At least one conducive material can be deposited to form electrically conductive layers (146, 246). The at least one conductive material can include a metallic liner and a conductive fill material layer. The metallic liner can include a metallic nitride material such as TiN, TaN, WN, an alloy thereof, or a stack thereof. The metallic liner functions as a diffusion barrier layer and an adhesion promotion layer. The metallic liner can be deposited by a conformal deposition method such as chemical vapor deposition (CVD) or atomic layer deposition (ALD), and can have a thickness in a range from 1 nm to 6 nm, although lesser and greater thicknesses can also be employed. The conductive fill material layer can be deposited directly on the metallic liner by a conformal deposition method such as chemical vapor deposition or atomic layer deposition. The conductive fill material layer includes a conductive material. The conductive material can include at least one elemental metal such as W, Cu, Co, Mo, Ru, Au, and Ag. Additionally or alternatively, the conductive fill material layer (146, 246) can include at least one intermetallic metal alloy material. Each intermetallic metal alloy material can include at least two metal elements selected from W, Cu, Co, Mo, Ru, Au, Ag, Pt, Ni, Ti, and Ta. In one embodiment, the conductive fill material layer can consist essentially of W, Co, Mo, or Ru.

Each portion of the at least one conducive material that fills a backside recess (143 or 243) constitutes an electrically conductive layer (146 or 246). The electrically conductive layers (146, 246) include first electrically conductive layers 146 that are formed in the first backside recesses 143 in the first tier structure, and second electrically conductive layers 246 that are formed in the second backside recesses 243 in the second tier structure. The portion of the at least one conductive material that excludes the electrically conductive layers (146, 246) constitutes continuous metallic material layer 46L. A plurality of electrically conductive layers (146, 246) can be formed in the plurality of backside recesses (143, 243), and the continuous metallic material layer 46L can be formed on the sidewalls of each backside trench 79 and over the contact level dielectric layer 80. A backside cavity is present in the portion of each backside trench 79 that is not filled with the backside blocking dielectric layer and the continuous metallic material layer 46L.

While the backside recesses (143, 243) remain as cavities, i.e., between removal of the sacrificial material layers (142, 242) and formation of the electrically conductive layers (146, 246) in the backside recesses (143, 243), the first support pillar structures 227, the second support pillar structures 155, and the memory stack structures 55 support the first and second insulating layers (132, 142), the insulating cap layer 70, and the contact level dielectric layer 80. Thus, each first sacrificial material layer 142 can be replaced with a respective first electrically conductive layer 146, and each second sacrificial material layer 242 can be replaced with a respective second electrically conductive layer 246, while the first support pillar structures 227, the second support pillar structures 155, and the memory stack structures 55 provide structural support to the first and second insulating layers (132, 232).

Referring to FIGS. 21A and 21B, the deposited metallic material of the continuous electrically conductive material layer 46L is etched back from the sidewalls of each backside trench 79 and from above the contact level dielectric layer 80, for example, by an isotropic wet etch, an anisotropic dry etch, or a combination thereof. The electrically conductive layers (146, 246) in the backside recesses are not removed by the etch process. In one embodiment, the sidewalls of each electrically conductive layer (146 or 246) can be vertically coincident after removal of the continuous electrically conductive material layer 46L.

Each electrically conductive layer (146 or 246) can function as a combination of a plurality of control gate electrodes located at a same level and a word line electrically interconnecting, i.e., electrically shorting, the plurality of control gate electrodes located at the same level. The plurality of control gate electrodes within each electrically conductive layer (146 or 246) are the control gate electrodes for the vertical memory devices including the memory stack structures 55. In other words, each electrically conductive layer (146 or 246) can be a word line that functions as a common control gate electrode for the plurality of vertical memory devices.

Referring to FIGS. 22A and 22B, an insulating material layer can be formed in the at least one backside trench 79 and over the contact level dielectric layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the contact level dielectric layer 80 and at the bottom of each backside trench 79. Each remaining portion of the insulating material layer constitutes an insulating spacer 74. The anisotropic etch can continue to etch through physically exposed portions of the planar dielectric portion, if present, in each backside trench 79. Thus, an insulating spacer 74 is formed in each backside trench 79 directly on physically exposed sidewalls of the electrically conductive layers (146, 246).

A source region 61 can be formed underneath each backside trench 79 by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74. A surface portion of the semiconductor material layer 10 adjoining a source region 61 and continuously extending to the epitaxial pedestals 11 constitutes a horizontal semiconductor channel 59, which is a common portion of a plurality of semiconductor channels (59, 11, 60) that include the vertical semiconductor channels 60 within the memory stack structures 55.

A backside contact via structure 76 can be formed within each cavity. Each contact via structure 76 can fill a respective cavity. The backside contact via structures 76 can be formed by depositing at least one conductive material in the remaining unfilled volume (i.e., the backside cavity) of the backside trench 79. For example, the at least one conductive material can include a conductive liner (not expressly shown) and a conductive fill material portion (not expressly shown). The conductive liner can include a metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 80 overlying the alternating stacks (132, 146, 232, 246) as a stopping layer. If chemical mechanical planarization (CMP) process is employed, the contact level dielectric layer 80 can be employed as a CMP stopping layer. Each remaining continuous portion of the at least one conductive material in the backside trenches 79 constitutes a backside contact via structure 76. Each backside contact via structure 76 can be formed directly on a top surface of a source region 61. Each backside contact via structure 76 can contact a respective source region 61, and can be laterally surrounded by a respective insulating spacer 74.

Referring to FIGS. 23A and 23B, additional contact via structures (88, 86) can be formed through the contact level dielectric layer 80 and through the retro-stepped dielectric material portions (165, 265). For example, drain contact via structures 88 can be formed through the contact level dielectric layer 80 on each drain region 63. Each drain contact via structure 88 can be formed through the contact level dielectric layer 80 on each of the drain regions 63, while not forming any conductive structure through the contact level dielectric layer 80 over the doped semiconductor material portions of the dummy drain regions 163. Subsequently, bit lines (not shown) are formed in electrical contact with each drain region 63 but not with each dummy drain region 163.

Control gate contact via structures 86 can be formed in the terrace region on the electrically conductive layers (146, 246) through the contact level dielectric layer 80, and through the retro-stepped dielectric material portions (165, 265). The control gate contact via structures 86 vertically extend at least through a dielectric material portion (i.e., the second retro-stepped dielectric material portion 265) within the second tier structure (232, 246, 265, 70), and contact a respective electrically conductive layer selected from the first and second electrically conductive layers (146, 246). Peripheral gate contact via structures (not shown) and peripheral active region contact via structures (not shown) can be formed through the retro-stepped dielectric material portions (165, 265) directly on respective nodes of the peripheral devices 700 (See FIG. 1).

In an alternative embodiment of the first exemplary structure, the second support pillar structures 155 can be formed only within the second stepped area (i.e., the area of the second stepped surfaces) and not within the first stepped area (i.e., the area of the first stepped surfaces). Mechanical support within the area of the second tier structure (232, 242, 70, 265) that overlies the first stepped surfaces can be provided by the second retro-stepped dielectric material portion 265 during replacement of the second sacrificial material layers 242.

Lack of areal overlap between the first support pillar structures 227 and the second support pillar structures 155 prevents collateral damage to the first support pillar structures 227, the first sacrificial material layers 142, the first insulating layers 132, or the first tier dielectric cap layer 270 during formation of the second support pillar structures 155. By confining the physical extent of the second support pillar structures 155 within the level of the second tier structure (232, 242, 70, 265) and above the bottom surface of the first tier dielectric cap layer 270, word line electrical shorts and leakage current through the first support pillar structures 227 can be minimized. Further, by avoiding an additional etch process for removal of the material of the first support pillar structures 227 after formation of the second support openings 241, damage to the sidewalls of the second sacrificial material layers 242 and the second insulating layers 232 can be minimized.

Figure 25:
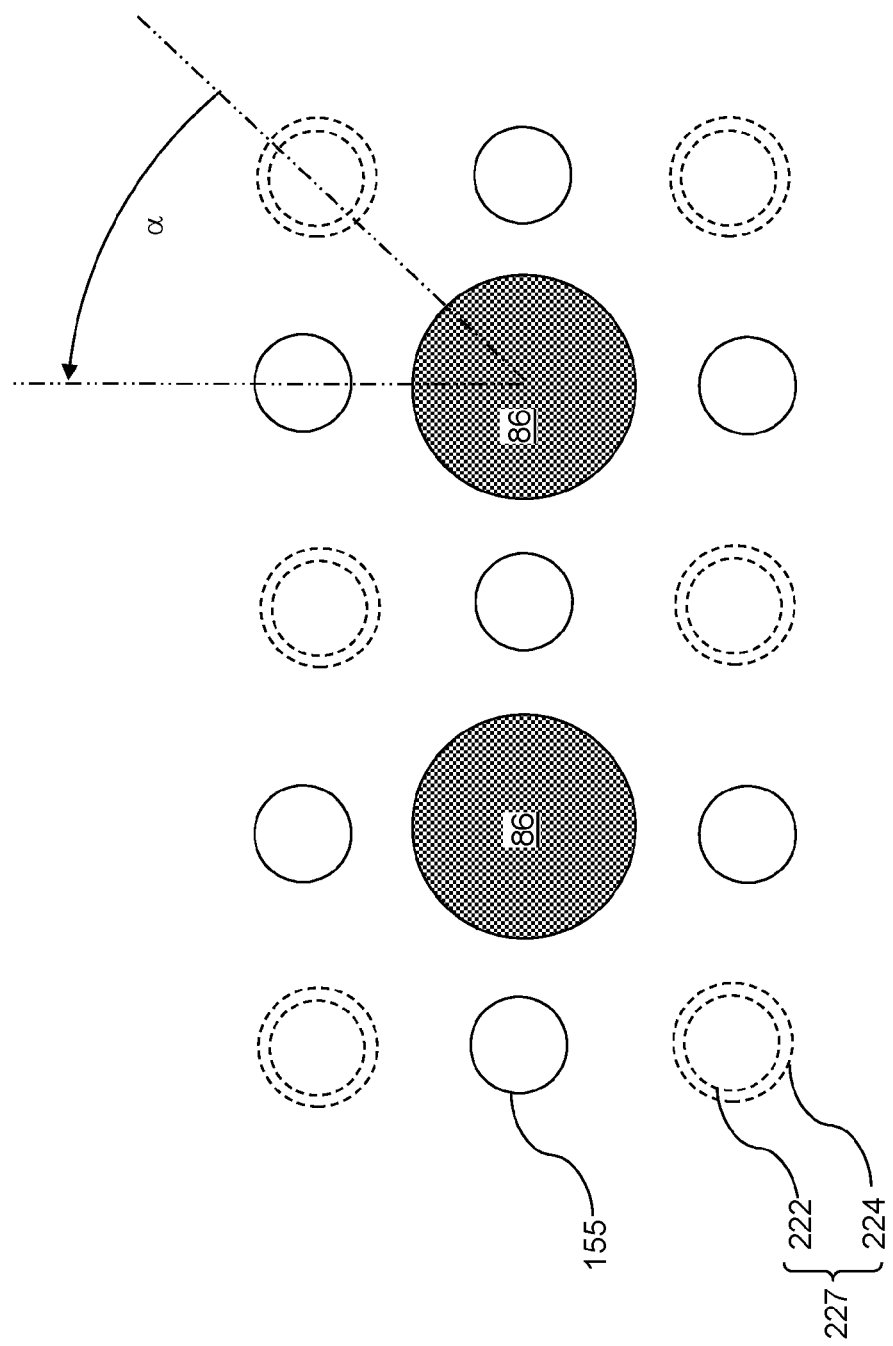
FIG. 25 is a see-through top-down view of a region of the first exemplary structure in case control gate contact via structures, first support pillar structures, and second support pillar structures are arranged in a first configuration.
Figure 26:
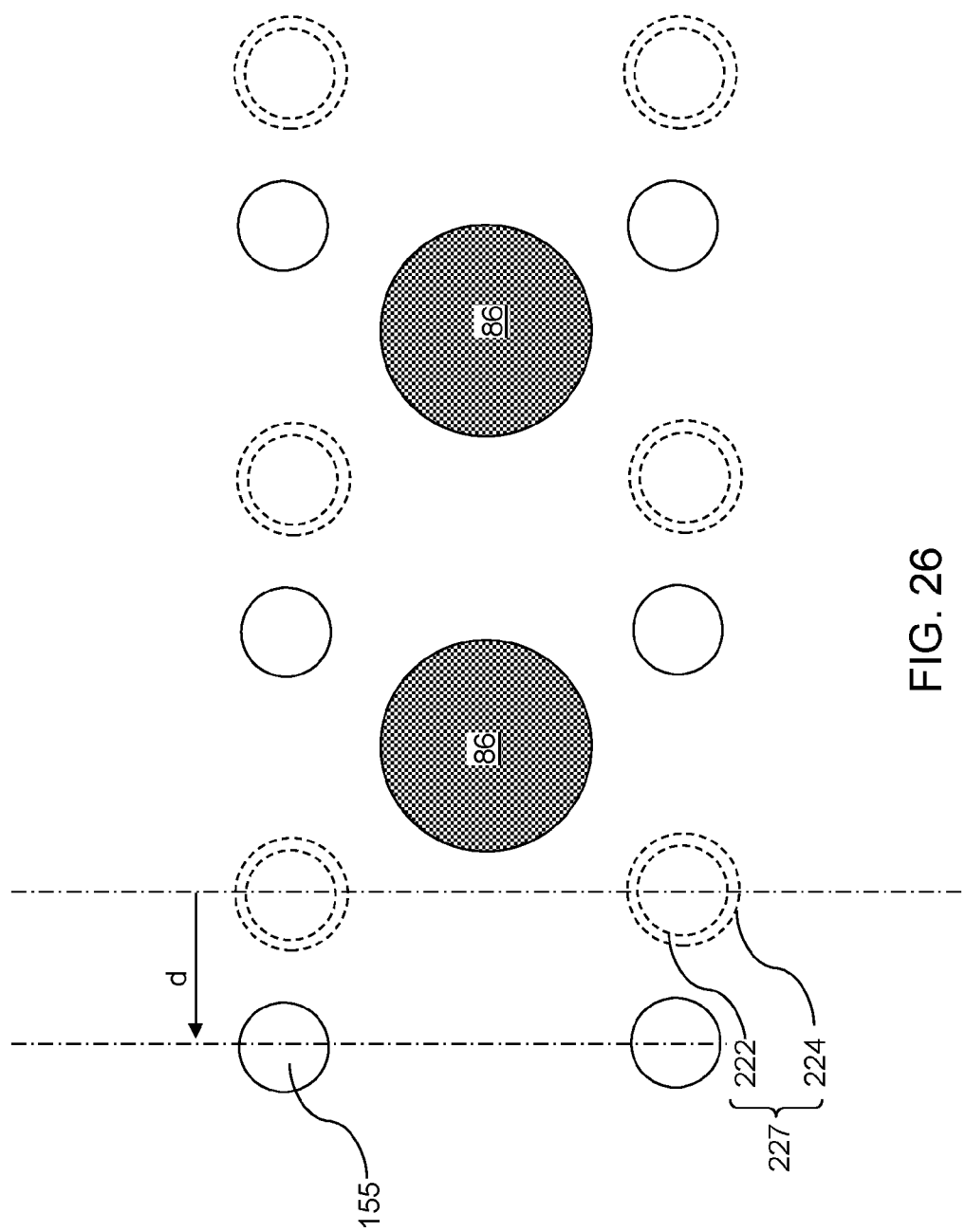
FIG. 26 is a see-through top-down view of a region of the first exemplary structure in case control gate contact via structures, first support pillar structures, and second support pillar structures are arranged in a second configuration.
Figure 27:
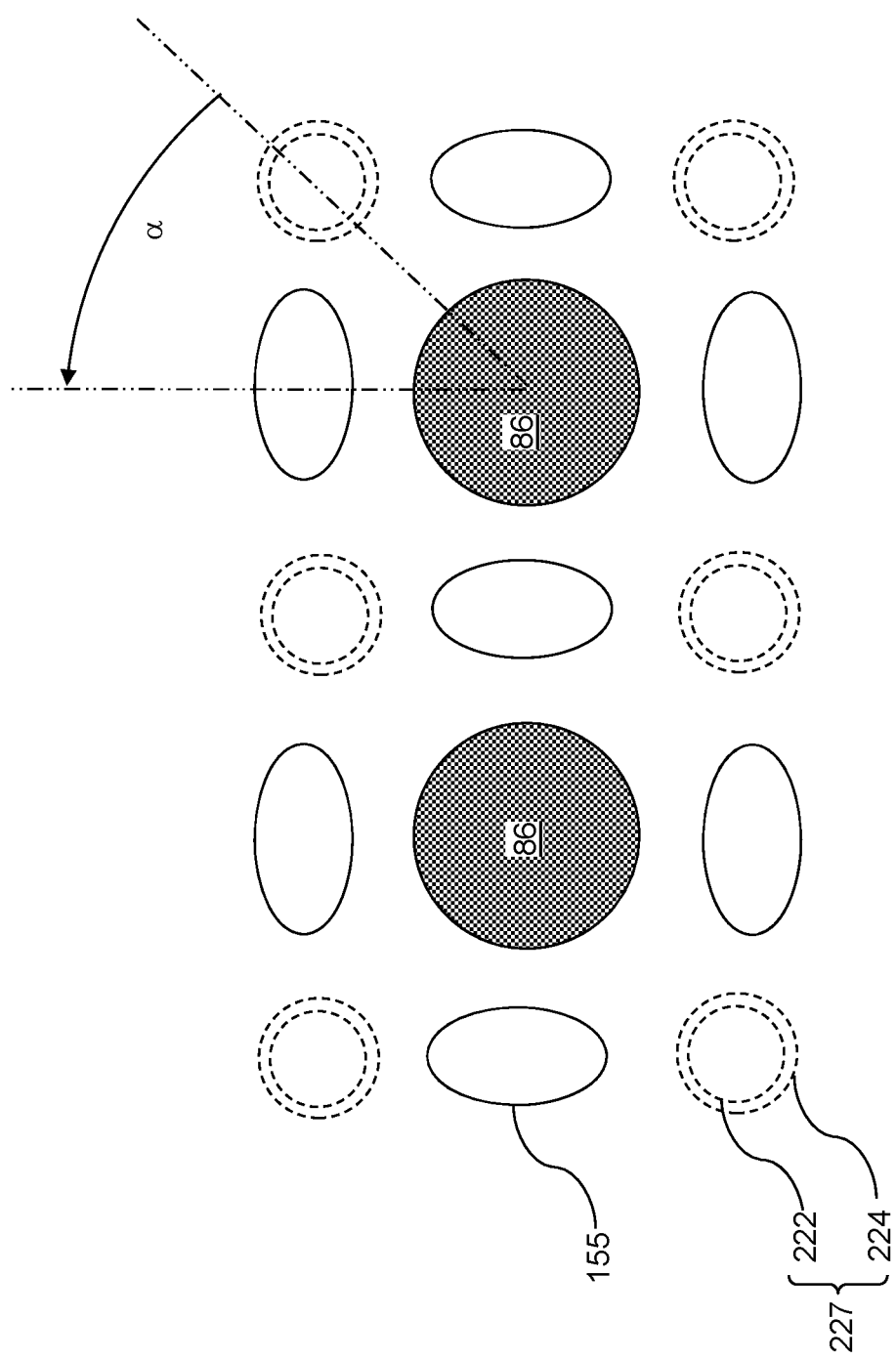
FIG. 27 is a see-through top-down view of a region of the first exemplary structure in case control gate contact via structures, first support pillar structures, and second support pillar structures are arranged in a third configuration.

Various configurations can be employed for the arrangement of the control gate contact via structures 86, the first support pillar structures 227, and the second support pillar structures 155 to avoid areal overlap between the first support pillar structures 227 and the second support pillar structures 155. FIGS. 25-27 illustrate three exemplary configurations that can be employed to avoid areal overlap, and thus to avoid physical contact, between the set of all first support pillar structures 227 and the set of all second support pillar structures 155.

Referring to FIGS. 23A and 25, a first configuration for arrangement of control gate contact via structures 86, first support pillar structures 227, and second support pillar structures 155 is illustrated. In the first configuration, the first support pillar structures 227 and the second support pillar structures 155 that laterally surround a same control gate contact via structure 86 are azimuthally offset from each other by an azimuthal offset angle α. Specifically, positions of most proximate second support pillar structures 155 surrounding a given contact via structure (as embodied as a control gate contact via structure 86 that contacts a respective electrically conductive layer (146 or 246)) are azimuthally offset from positions of most proximate first support pillar structures 227 surrounding the contact via structure with respect to a vertical axis passing through the geometrical center of the contact via structure by the azimuthal offset angle α, which can be in a range from 10 degrees to 80 degrees, and may be within a range from 30 degrees to 60 degrees (such as 45 degrees). In one embodiment, each of the second support openings does not overlap with the first support pillar structures located in the first support openings, and positions of most proximate second support pillar structures surrounding a contact via structure have no overlap with the positions of most proximate first support pillar structures surrounding the contact via structure with respect to a vertical axis passing through a geometrical center of the contact via structure. In addition, the positions of the most proximate second support pillar structures 155 surrounding the given contact via structure can be radially offset from positions of the most proximate first support pillar structures 227 surrounding the contact via structure from the vertical axis passing through the geometrical center of the contact via structure. In other words, the most proximate second support pillar structures 155 surrounding the given contact via structure can have a different distance to the vertical axis than the most proximate first support pillar structures 227 surrounding the contact via structure.

Referring to FIGS. 24A, 24B and 26, a second configuration for arrangement of control gate contact via structures 86, first support pillar structures 227, and second support pillar structures 155 is illustrated. In the second configuration, positions the second support pillar structures 155 are laterally offset from positions of the first support pillar structures 227 by a uniform lateral offset distance d. The lateral offset of the second support pillar structures 155 with respect to the first support pillar structures 227 can be along the lengthwise direction (e.g., word line direction) of the backside trench 79 (see for example, FIGS. 19A and 24A). In one embodiment, the second support pillar structures 155 and the first support pillar structures 227 can be arranged as one-dimensional arrays having a pitch along the lengthwise direction of the backside trench 79, and the uniform lateral offset distance d can be less than the pitch of the second support pillar structures along the lengthwise direction of the backside trench 79.

Referring to FIG. 27, a third configuration for arrangement of control gate contact via structures 86, first support pillar structures 227, and second support pillar structures 155 is illustrated. In the third configuration, each of the first support pillar structures 227 has a first horizontal cross-sectional shape (such as a circle, an ellipse, or a first polygon), and each of the second support pillar structures 155 has a second horizontal cross-sectional shape (such as an ellipse, a second polygon, or a circle) such that the second horizontal cross-sectional shape is not congruent with (i.e., different from) the first horizontal cross-sectional shape. In one embodiment, the first horizontal cross-sectional shape can be an ellipse (with a positive eccentricity) or a circle (with eccentricity of zero) having a first eccentricity, and the second horizontal cross-sectional shape can be an ellipse or a circle having a second eccentricity that is different from the first eccentricity. In another embodiment, the first horizontal cross-sectional shape can be a polygon with n sides, and the second horizontal cross-sectional shape can be another polygon with m sides such that m is not the same as n. In yet another embodiment, one of the first and second horizontal cross-sectional shapes can be an ellipse of a circle, and another of the first and second horizontal cross-sectional shapes can be a polygon. In still another embodiment, the first horizontal cross-sectional shape can have a different area than the second horizontal cross-sectional shape.

While the present disclosure is described employing three exemplary configurations for arrangement of control gate contact via structures 86, first support pillar structures 227, and second support pillar structures 155, the various geometrical features of the three exemplary configurations can be combined to provide derived configurations. For example, rotation, lateral displacement, and change of shapes can be combined in determining the shape and placement of the second support pillar structures 155 with respect to the placement of the first support pillar structures 227. Furthermore, the second support pillar structures 155 can have a different (e.g., larger or smaller) width (e.g., diameter) than the first support pillar structures 227. Furthermore, the second support pillar structures 155 may have at least one different material compared to the first support pillar structures 227.

The method of the present disclosure can be repeated over multiple tiers to simultaneously form memory stack structures that extend over more than two tier structures and topmost support pillar structures embedded only within the topmost tier structure. FIG. 28 illustrates a second exemplary structure including three tier structures. The first tier structure includes a first alternating stack of first insulating layers 132 and first electrically conductive layers 146, and further includes a first retro-stepped dielectric material portion 165. The second tier structure includes a second alternating stack of second insulating layers 232 and second electrically conductive layers 246, and further includes a second retro-stepped dielectric material portion 265. The third tier structure includes a third alternating stack of third insulating layers 332 and third electrically conductive layers 346, and further includes a third tier dielectric cap layer 370 and a third retro-stepped dielectric material layer 365.

First support pillar structures 227 are formed within the first tier structure (132, 146, 165) employing the same methods as in the first embodiment. Second support pillar structures 267 are formed within the second tier structure (232, 246, 265) employing the same type of processing steps as the processing steps employed to form the first support pillar structures 227. Each of the second support pillar structures 227 can include a respective set of second tier fill material portions (262, 264). The topmost support pillar structures 155 can be formed simultaneously with formation of the memory stack structures 55 that extend through three tier structures.

The second support pillar structures 267 are shaped and positioned to avoid any areal overlap with the first support pillar structures 227. The topmost support pillar structures 155 are shaped and positioned to avoid any areal overlap with the second support pillar structures 267. In one embodiment, the pattern for the topmost support pillar structures 155 can be the same as the pattern for the first support pillar structures 227. In this case, the same lithographic mask can be employed to form first memory openings and first support openings through a first alternating stack of the first insulating layers 132 and first sacrificial material layers in a first tier structure, and to form third memory openings and third support openings through a third alternating stack of the third insulating layers 332 and third sacrificial material layers in a third tier structure. The second exemplary structure avoids physical contact among the various support pillar structures (227, 267, 155), and thus, reduces collateral etch damage to the various material layers and reduces, or eliminates, electrical leakage current through the various support pillar structures (227, 267, 155).

It is understood that ordinals are employed merely to distinguish similar elements. As such, the topmost support pillar structures 155 of the second exemplary structure can be viewed as second support pillar structures in the claims, and the third tier structure of the second exemplary structure can be viewed as a second tier structure in the claims.

The various exemplary structures of the present disclosure can include a three-dimensional memory device. The three-dimensional memory device can include a first tier structure (132, 146, 270, 165) comprising a first alternating stack of first insulating layers 132 and first electrically conductive layers 146 and located over a substrate (9, 10, 61); a second tier structure (232, 246, 70, 265) comprising a second alternating stack of second insulating layers 232 and second electrically conductive layers 246 and located over the first tier structure (132, 146, 270, 165); a plurality of memory stack structures 55 extending through the first tier structure (132, 146, 270, 165) and the second tier structure (232, 246, 70, 265); first support pillar structures 227 extending through the first tier structure (132, 146, 270, 165) but not through the second tier structure (232, 246, 70, 265); and second support pillar structures 155 extending through the second tier structure (232, 246, 70, 265) but not through the first alternating stack (132, 146). The second support pillar structures 155 are not in physical contact with any of the first support pillar structures 227.

In one embodiment, each of the memory stack structures 55 comprises a memory film 50 including a first layer stack (52, 54, 56), and each of the second support pillar structures 155 comprise a second layer stack (52, 54, 56). Each layer within the second layer stack (52, 54, 56) has a same thickness and a same material composition as a corresponding layer within the first layer stack (52, 54, 56). In one embodiment, the first layer stack (52, 54, 56) comprises a charge storage layer 54 and a tunneling dielectric layer 56.

In one embodiment, a bottommost surface of each second layer stack (52, 54, 56) contacts a top surface of a topmost layer of the first tier structure (132, 146, 270, 165), and each memory film 50 comprising the first layer stack (52, 54, 56) extends through the entirety of second electrically conductive layers 246 and a predominant subset of the first electrically conductive layers 146. In one embodiment, the predominant subset of the first electrically conductive layers 146 can include each first electrically conductive layer 146 that does not laterally surrounded an epitaxial pedestal 11 (or does not physically contact any tubular dielectric spacer 116).

In one embodiment, each of the memory stack structures 55 comprises a vertical semiconductor channel 60 including a semiconductor material, and each of the second support pillar structures 155 comprise a semiconductor material layer (as embodied as an electrically inactive vertical semiconductor channel 60) having a same composition as the vertical semiconductor channel 60. In one embodiment, a bottommost surface of each semiconductor material layer 60 in the second support pillar structures 155 contacts a top surface of a topmost layer of the first tier structure (132, 146, 270, 165), and each vertical semiconductor channel 60 in the memory stack structures 55 extends through the entirety of second electrically conductive layers 246 and a predominant subset of the first electrically conductive layers 146.

In one embodiment, each of the second support pillar structures 155 comprises at least one different material than any material of the first support pillar structures 227, which can be, for example, any of the dielectric materials in the memory films 50. In one embodiment, each of the first support pillar structures 227 contains at least one semiconductor material portion (as embodied as the first support opening fill portions 222 and the second support opening fill portions 224) which is different in composition and/or thickness from that of the semiconductor channel 60, contacts a top surface of the substrate (9, 10, 61), and contacts a bottom surface of a bottommost layer of the second tier structure (232, 246, 70, 265). The first support pillar structures 227 lack the semiconductor channel 60 and/or the first layer stack (52, 54, 56) which comprises a charge storage layer 54 and a tunneling dielectric layer 56.

In one embodiment, a terrace region can be provided, in which each electrically conductive layer (146, 246) other than a topmost electrically conductive layer within the first and second alternating stacks (132, 146, 232, 246) laterally extends farther than any overlying electrically conductive layer within the first and second alternating stacks (132, 146, 232, 246). The terrace region includes stepped surfaces of the first and second alternating stacks (132, 146, 232, 246) that continuously extend from a bottommost layer within the first and second alternating stacks (132, 146, 232, 246) to a topmost layer within the first and second alternating stacks (132, 146, 232, 246). Each subset of the first and second support pillar structures (227, 155) extends through the stepped surfaces and through a respective retro-stepped dielectric material portion (165 or 265) that overlies the stepped surfaces.

Each of the word line contact via structures 86 can contact a respective electrically conductive layer among the first and second electrically conductive layers (146, 246) in the terrace region.

Each of the first and second exemplary structures can include a three-dimensional memory device. In one embodiment, the three-dimensional memory device comprises a vertical NAND memory device. The electrically conductive layers (146, 246) can comprise, or can be electrically connected to, a respective word line of the monolithic three-dimensional NAND memory device. The substrate (9, 10, 61) can comprise a silicon substrate. The vertical NAND memory device can comprise an array of monolithic three-dimensional NAND strings over the silicon substrate. At least one memory cell (as embodied as a portion of a memory material layer 54 at a level of an electrically conductive layer (146, 246)) in a first device level of the array of monolithic three-dimensional NAND strings can be located over another memory cell (as embodied as another portion of the memory material layer 54 at a level of another electrically conductive layer (146, 246)) in a second device level of the array of monolithic three-dimensional NAND strings. The silicon substrate can contain an integrated circuit comprising a driver circuit for the memory device located thereon. The electrically conductive layers (146, 246) can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10, 61); and a plurality of charge storage elements (as embodied as portions of the memory material layer located at levels of the electrically conductive layers (146, 246)). Each charge storage element can be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
a first tier structure comprising a first alternating stack of first insulating layers and first electrically conductive layers located over a substrate;
a second tier structure comprising a second alternating stack of second insulating layers and second electrically conductive layers located over the first tier structure;
a plurality of memory stack structures extending through the first tier structure and the second tier structure;
first support pillar structures extending through the first tier structure but not through the second tier structure; and
second support pillar structures extending through the second tier structure but not through the first alternating stack,
wherein the second support pillar structures are not in direct physical contact with any of the first support pillar structures.

2. The three-dimensional memory device of claim 1, wherein:
each of the memory stack structures comprises a memory film including a first layer stack; and
each of the second support pillar structures comprise a second layer stack, wherein each layer within the second layer stack has a same thickness and a same material composition as a corresponding layer within the first layer stack.

3. The three-dimensional memory device of claim 2, wherein the first layer stack comprises a charge storage layer and a tunneling dielectric layer.

4. The three-dimensional memory device of claim 2, wherein:
a bottommost surface of each second layer stack contacts a top surface of a topmost layer of the first tier structure; and
each memory film comprising the first layer stack extends through an entirety of second electrically conductive layers and a predominant subset of the first electrically conductive layers.

5. The three-dimensional memory device of claim 2, wherein:
each of the memory stack structures comprises a vertical semiconductor channel including a semiconductor material; and
each of the second support pillar structures comprise a semiconductor material layer having a same composition as the vertical semiconductor channel.

6. The three-dimensional memory device of claim 5, wherein:
a bottommost surface of each semiconductor material layer contacts a top surface of a topmost layer of the first tier structure; and
each vertical semiconductor channel extends through an entirety of second electrically conductive layers and a predominant subset of the first electrically conductive layers.

7. The three-dimensional memory device of claim 5, wherein each of the first support pillar structures comprises at least one semiconductor material portion which is different in at least one composition or thickness from that of the vertical semiconductor channel, contacts a top surface of the substrate, and contacts a bottom surface of a bottommost layer of the second tier structure.

8. The three-dimensional memory device of claim 7, wherein each of the second support pillar structures comprises at least one different material than any material of the first support pillar structures, and wherein each of the first support pillar structures lacks the vertical semiconductor channel, a charge storage layer and a tunneling dielectric layer.

9. The three-dimensional memory device of claim 1, further comprising a terrace region in which each electrically conductive layer other than a topmost electrically conductive layer within the first and second alternating stacks laterally extends farther than any overlying electrically conductive layer within the first and second alternating stacks,
wherein:
the terrace region includes stepped surfaces of the first and second alternating stacks that continuously extend from a bottommost layer within the first and second alternating stacks to a topmost layer within the first and second alternating stacks; and
each subset of the first and second support pillar structures extends through the stepped surfaces and through a respective retro-stepped dielectric material portion that overlies the stepped surfaces.

10. The three-dimensional memory device of claim 9, further comprising contact via structures each contacting a respective electrically conductive layer among the first and second electrically conductive layers in the terrace region.

11. The three-dimensional memory device of claim 10, wherein positions of most proximate second support pillar structures surrounding a contact via structure are azimuthally offset from positions of most proximate first support pillar structures surrounding the contact via structure with respect to a vertical axis passing through a geometrical center of the contact via structure by an angle in a range from 10 degrees to 80 degrees.

12. The three-dimensional memory device of claim 10, wherein positions of the second support pillar structures are laterally offset from positions of the first support pillar structures by a uniform lateral offset distance.

13. The three-dimensional memory device of claim 10, wherein:
each of the first support pillar structures has a first horizontal cross-sectional shape;

each of the second support pillar structures has a second horizontal cross-sectional shape; and the second horizontal cross-sectional shape is not congruent with the first horizontal cross-sectional shape.

14. The three-dimensional memory device of claim 1, wherein:

the three-dimensional memory device comprises a monolithic three-dimensional NAND memory device;

the first and second electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the first and second electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate; and a plurality of charge storage elements, each charge storage element located adjacent to a respective one of the plurality of semiconductor channels.

15. A three-dimensional memory device comprising:

a first tier structure comprising a first alternating stack of first insulating layers and first electrically conductive layers located over a substrate;

a second tier structure comprising a second alternating stack of second insulating layers and second electrically conductive layers located over the first tier structure;

a plurality of memory stack structures extending through the first tier structure and the second tier structure;

first support pillar structures extending through the first tier structure but not through the second tier structure; and second support pillar structures extending through the second tier structure but not through the first alternating stack, wherein the second support pillar structures do not overlap with any of the first support pillar structures.

* * * * *